US006501774B2

(12) United States Patent
Kuwahara et al.

(10) Patent No.: US 6,501,774 B2
(45) Date of Patent: Dec. 31, 2002

(54) OPTICAL TRANSMISSION APPARATUS FOR MULTIPLE WAVELENGTHS AND OPTICAL TRANSMISSION WAVELENGTH CONTROL METHOD

(75) Inventors: Hiroshi Kuwahara, Sapporo (JP); Norio Nagase, Sapporo (JP); Setsuo Misaizu, Sapporo (JP); Tetsuya Kiyonaga, Kawasaki (JP); Tomoyuki Otsuka, Kawasaki (JP); Motoyoshi Sekiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/983,184

(22) Filed: Oct. 23, 2001

(65) Prior Publication Data
US 2002/0126367 A1 Sep. 12, 2002

Related U.S. Application Data

(63) Continuation of application No. PCT/JP99/03561, filed on Jul. 1, 1999.

(51) Int. Cl.[7] .............................. H01S 3/13; H01S 3/04
(52) U.S. Cl. ........................ 372/32; 372/34; 372/29.02
(58) Field of Search ........................ 372/32, 34, 29.02; 359/180, 187

(56) References Cited

U.S. PATENT DOCUMENTS 4,998,256 A * 3/1991 Ohshima et al. ............... 372/32
5,784,506 A * 7/1998 Pfeiffer ........................ 385/24
6,212,210 B1 * 4/2002 Serizawa ..................... 372/32

FOREIGN PATENT DOCUMENTS

| EP | 0 911 928 | 4/1999 |
| JP | 07-177093 | 7/1995 |
| JP | 9-298511 | 11/1997 |
| JP | 10-013381 | 1/1998 |
| JP | 11-126940 | 5/1999 |

* cited by examiner

Primary Examiner—Paul Ip
Assistant Examiner—James Menefee
(74) Attorney, Agent, or Firm—Staas & Halsey LLP

(57) ABSTRACT

The optical transmission apparatus for multiple wavelengths according to the present invention comprises; a light source, a temperature control section for controlling the temperature of the light source, a temperature control (ATC) loop for controlling the operation of the temperature control section, and a wavelength control (AFC) loop. The ATC loop detects the temperature of the light source and feedback controls the operation of the temperature control section, so that the optical output wavelengths of the light source fall within a wavelength capture range corresponding to a target wavelength of the AFC loop. The AFC loop has a wavelength detection filter having a periodic transmission wavelength characteristic. After the operation of the ATC loop has stabilized, a wavelength capture operation is commenced, and the operation of the temperature control section is controlled so that the optical output wavelength of the light source is captured at a stable point corresponding to a target wavelength, among a plurality of stable points.

12 Claims, 26 Drawing Sheets

OPTICAL TRANSMISSION APPARATUS FOR MULTIPLE WAVELENGTHS AND OPTICAL TRANSMISSION WAVELENGTH CONTROL METHOD

This application is a continuation of PCT/JP99/03561 filed on Jul. 1, 1999.

TECHNICAL FIELD

The present invention relates to an optical transmission apparatus and an optical transmission wavelength control method, used in wavelength division multiplexed (WDM) optical transmission systems. In particular, the invention relates to an optical transmission apparatus for multiple wavelengths, which can switch and transmit optical signals of a plurality of wavelengths, and an optical transmission wavelength control method.

BACKGROUND ART

With recent high information orientation, in optical communication, a significant increase in transmission capacity together with a reduction in transmission cost is required. In order to meet these requirements, up until now a transmission speed has mainly been increased. However, with an ultra high transmission speed, it has become technically difficult to bring such optical communication into practical use. Furthermore, an increase in cost has been resulted. Therefore, wavelength division multiplexed (WDM) techniques enabling of transmitting a plurality of optical signals of different wavelengths on a single optical fiber, are attracted attention.

In a WDM optical transmission system, in general, a plurality of optical signals with equal inter-wavelength spacing are transmitted via a single optical fiber. However, in the case of systems and the like for realizing 32 waves multiplexing conforming to ITU (International Telecommunication Union) recommendations for example, the inter-wavelength spacing becomes narrow at 0.8 nm. Therefore, suppression of inter-channel crosstalk has been attempted by providing a narrow-band optical filter in the optical multiplexing apparatus or the like to perform the limitation of band and attenuating wavelengths other than the necessary wavelengths.

However, if the wavelength of the optical signal output from the optical transmission apparatus and the like is deviated from the transmission central wavelength of the narrow-band optical filter, the optical output power is attenuated by the narrow-band optical filter, and thus reduced so that transmission quality is degraded. Therefore, since it becomes necessary to coincide the optical output wavelength of the optical transmission apparatus with the central wavelength of the narrow-band optical filter of the optical multiplexing apparatus, a wavelength control of the optical output is required to be performed with good accuracy.

In a wavelength control performed by a conventional optical transmission apparatus, for example, a part of light output from a laser diode (LD) is taken out, and input into a wavelength detection filter in which an optical filter with the transmissivity differing depending on wavelength is used. Light that has passed through the wavelength detection filter is received by a photodiode (PD), and a PD output current is converted into a voltage. Thereafter, this voltage is compared with a reference voltage set corresponding to the central wavelength of the narrow-band optical filter and the temperature of the LD is then controlled so that the respective voltages become equal to each other (wavelength deviation disappears), thereby making the optical output wavelength correspond to the central wavelength of the narrow-band optical filter.

In such a conventional optical transmission apparatus, the wavelength control is fixedly performed limited to a single wavelength. Therefore, in a WDM optical transmission system with a large number of wavelengths, optical devices such as LDs and optical filters and so forth are required for each wavelength. However, these optical devices suffer from problems in manufacturability and availability. Furthermore, since the wavelength control is limited to single fixed wavelengths only, this has the drawback of poor expandability on the user side. In addition, if a backup configuration for dealing with failures and so forth is considered, this also becomes extremely disadvantageous cost-wise since the number of parts is further increased.

The present invention takes into consideration the above-mentioned situation, with the object of providing an optical transmission apparatus for multiple wavelengths, enabling of setting optical output wavelengths with a high degree of freedom.

DISCLOSURE OF THE INVENTION

In order to achieve the above object, there is provided an optical transmission apparatus for multiple wavelengths according to the present invention comprising; a light source for generating light for which the wavelength changes according to temperature, temperature control means for controlling temperature of the light source, and a wavelength control loop for detecting wavelengths of light output from the light source and feedback controlling an operation of the temperature control means based on the detected optical output wavelengths, to thereby capture the optical output wavelengths which are within a predetermined wavelength capture range into the vicinity of a target wavelength, wherein the optical transmission apparatus for multiple wavelengths further comprises a temperature control loop for detecting the temperature of the light source and feedback controlling the operation of the temperature control means in accordance with the detected temperature so that the optical output wavelengths of the light source fall within a wavelength capture range corresponding to the target wavelength of the wavelength control loop, and the wavelength control loop detects the optical output wavelengths of the light source using a wavelength detection filter having a transmission wavelength characteristic capable of setting a plurality of stable points for a wavelength capture operation, and starts the wavelength capture operation after an operation of the temperature control loop has stabilized.

With such a construction, as a preliminary operation for wavelength capture control by the wavelength control loop, a temperature control of the light source is performed by the temperature control loop so that the optical output wavelengths of the light source fall within a wavelength capture range corresponding to the target wavelength of the wavelength control loop. Then, when the operation of the temperature control loop becomes stable, the wavelength capture operation by the wavelength control loop is started. This wavelength capture operation is performed using the wavelength detection filter having a transmission wavelength characteristic capable of setting a plurality of stable points, and the optical output wavelengths of the light source are capture controlled to a stable point which corresponds to a target wavelength among the plurality of stable points.

Furthermore, in the optical transmission apparatus for multiple wavelengths, the wavelength detection filter preferably has a periodic transmission wavelength characteristic. By using such a wavelength detection filter, a wavelength deviation due to circuit errors and the like becomes small, and hence the wavelength control is accurately performed.

Moreover, in the case where the wavelength detection filter having the above mentioned periodic transmission wavelength characteristic is used, the wavelength control loop may incorporate a control polarity switching section which reverses a control direction of the capture operation in accordance with the switching of the target wavelength.

By having such a construction, the control direction of the capture operation can be selected in accordance with the set target wavelength. Therefore, the stable points of the wavelength control can be doubled.

In addition, in the abovementioned optical transmission apparatus, there may be provided control loop switching means for selectively switching either one of the temperature control loop and the wavelength control loop based on control conditions of the temperature control means.

With such a construction, the operation of the temperature control means is not controlled by a multiple loop construction of the temperature control loop and the wavelength control loop, so that a wavelength control time until the optical output wavelength becomes stable is shortened.

Furthermore, as a specific construction for the temperature control loop, this may comprise; a temperature sensor that detects the temperature of the light source and transmitting this to the temperature control means, and a target temperature setting section that sets, depending on the setting of the target wavelength, a target temperature in the temperature control means such that the optical output wavelengths of the light source fall within the wavelength capture range corresponding to the target wavelength of the wavelength control loop.

Moreover, in the abovementioned temperature control loop, it is preferable that there is provided a temperature storage section that stores the temperature of the light source detected by the temperature sensor when the optical output wavelengths of the light source have stabilized in the vicinity of the target wavelength, and the target temperature setting section sets a target temperature corresponding to the target wavelength based on storage data of the temperature storage section.

With such a construction, an influence on the wavelength control due to the occurrence of wavelength drift is reduced, enabling an even more accurate wavelength control.

Furthermore, in the abovementioned optical transmission apparatus, the construction may be such that there is provided light shut off means for shutting off light output from the light source during a period from a starting of operation by the temperature control loop until the wavelength capture operation by the wavelength control loop becomes stable.

With such a construction, since the optical output is shut off at the time of wavelength control transition, the occurrence of inter-channel crosstalk can be avoided.

In an optical transmission wavelength control method according to the present invention for detecting wavelengths of light output from a light source and feedback controlling temperature of the light source based on the detected optical output wavelengths, to thereby capture optical output wavelengths which are within a predetermined wavelength capture range into the vicinity of a target wavelength, the temperature of the light source is controlled so that the optical output wavelengths of the light source fall within a wavelength capture range corresponding to a target wavelength of the wavelength control, and thereafter, the optical output wavelengths of the light source are detected using a wavelength detection filter having a transmission wavelength characteristic capable of multiply setting stable points for a wavelength capture operation of the wavelength control, and the wavelength capture operation is started depending on the detected optical output wavelengths.

BEST MODE FOR CARRYING OUT THE INVENTION

Hereunder is a description of an optical transmission apparatus according to the present invention, based on the appended drawings.

At first, basic means for realizing an optical transmission apparatus for multiple wavelengths will be considered.

Figure 1:
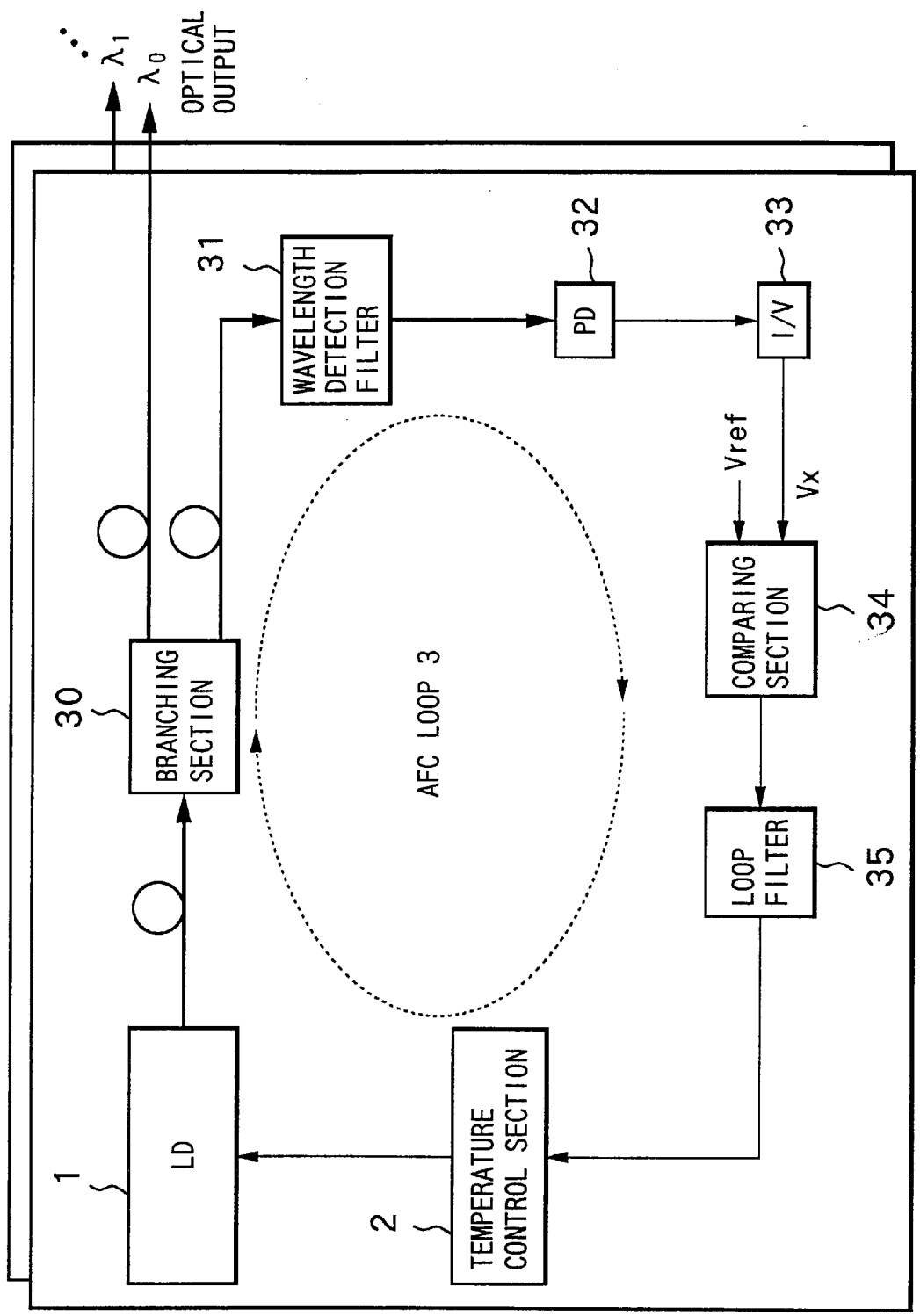
FIG. 1 is a block diagram showing a construction of a typical optical transmission apparatus provided with a wavelength control function.

FIG. 1 is a block diagram showing a construction of a typical optical transmission apparatus (not yet applicable to multiple wavelengths) provided with a wavelength control function.

The optical transmission apparatus of FIG. 1 comprises for example a laser diode (LD) 1 as a light source, a temperature control section 2 as temperature control means for controlling temperature of the LD 1, and an automatic wavelength (frequency) control loop 3 (hereunder, AFC loop 3) for detecting a wavelength of output light from the LD 1 and transmitting the detection result to the temperature control section 2 to control the optical output wavelength to be constant. In a WDM optical transmission system, a plurality of optical transmission apparatus respectively corresponding to optical signals of a plurality of wavelengths $\lambda_0, \lambda_1, \ldots$ are used.

The AFC loop 3 comprises a branching section 30, a wavelength detection filter 31, a photodiode (PD) 32, an I/V conversion section 33, a comparing section 34, and a loop filter 35. The branching section 30 branches a part of the light output from the LD 1 to send this to the wavelength detection filter 31. The wavelength detection filter 31 in which an optical filter with the transmissivity differing depending on wavelength is used, is input with the part of the optical output branched by the branching section 30. The PD 32 receives the light transmitted through the wavelength detection filter 31 and converts this to a current to output. The I/V conversion section 33 converts the current generated by the PD 32 to a voltage Vx. The comparing section 34 compares the output voltage Vx from the I/V conversion section 33 with a predetermined reference voltage Vref to output a signal corresponding to a difference between these voltages. The loop filter 35 is a circuit that receives the output signal from the comparing section 34 and has a time constant so that a temperature control of the LD 1 is performed stably. The signal which has passed through this loop filter 35 is transmitted to the temperature control section 2, and the temperature of the LD 1 is controlled by the temperature control section 2 so that the output voltage Vx and the reference voltage Vref become the same.

Figure 2:
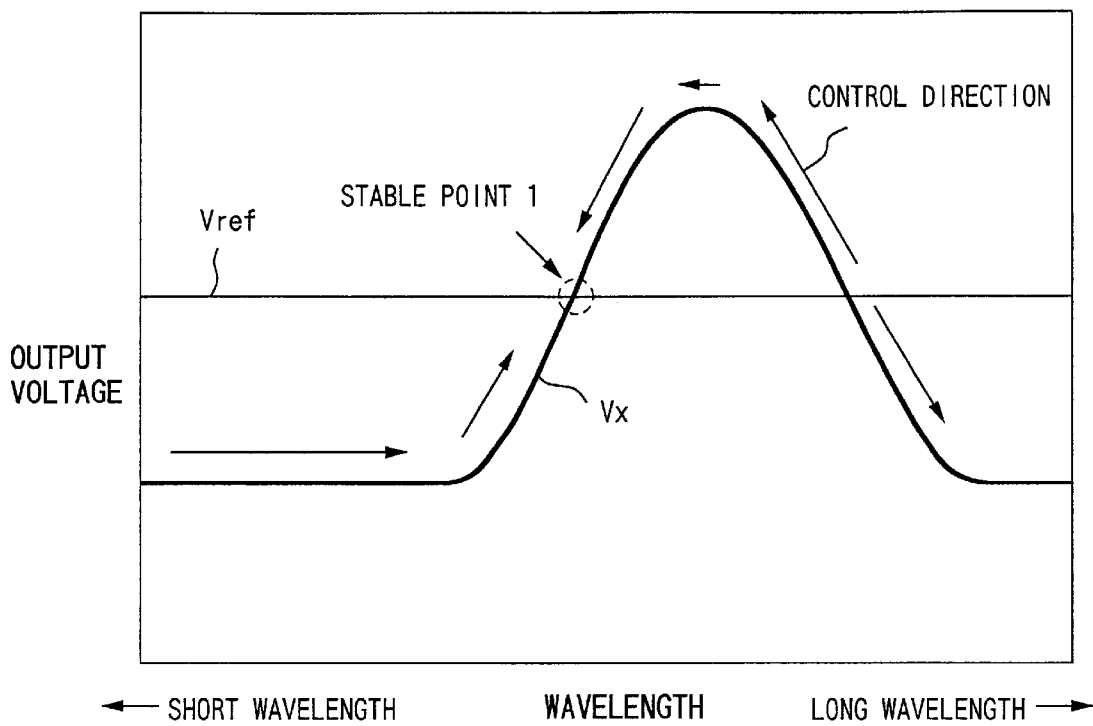
FIG. 2 is a diagram for explaining an operation of the optical transmission apparatus of FIG. 1.

In the abovementioned optical transmission apparatus, when the optical output wavelength of the LD 1 is changed, then as shown in FIG. 2, the output voltage Vx corresponding to the transmission wavelength characteristic of the wavelength detection filter 31 is generated. In the case where the output voltage Vx is less than the reference voltage Vref, the temperature of the LD 1 is controlled so that the optical output wavelength is shifted to a long wavelength side, while in the case where the output voltage Vx is higher than the reference voltage Vref, the temperature of the LD 1 is controlled so that the optical output wavelength is shifted to a short wavelength side. As a result, the optical output wavelength from the LD 1 is captured into a wavelength corresponding to an intersection point (stable point) of a rightward rising slope of the output voltage Vx and the reference voltage Vref in FIG. 2 to be stabilized at this wavelength.

Figure 3:
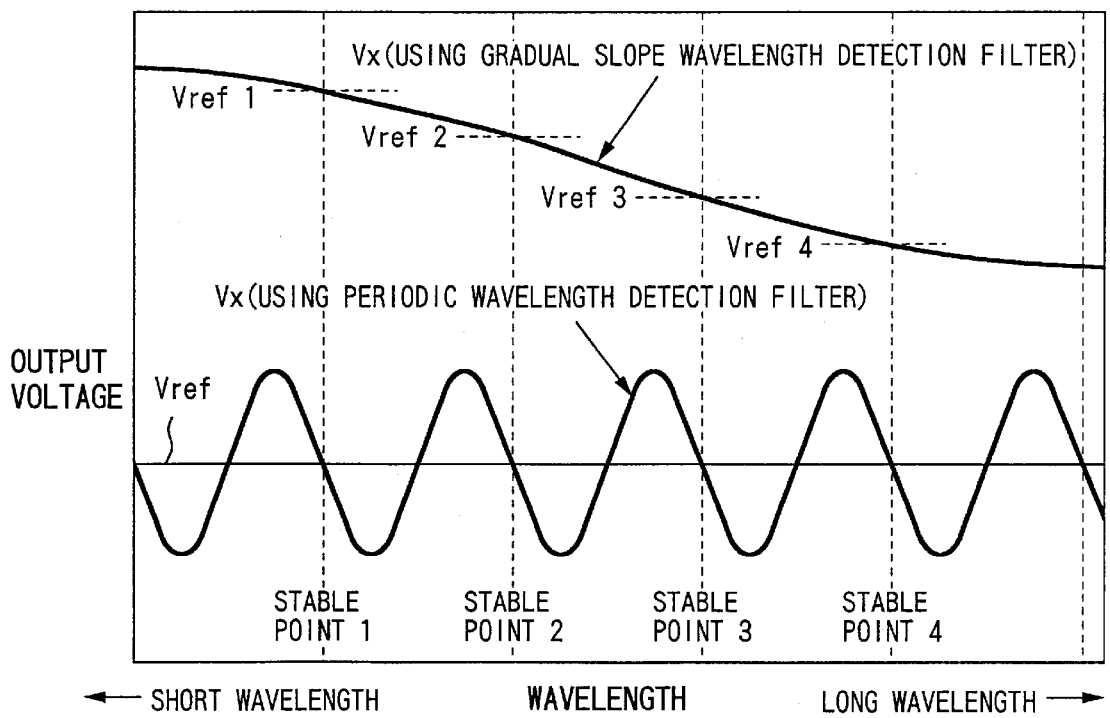
FIG. 3 is a diagram for explaining means for making the optical transmission apparatus of FIG. 1 applicable to multiple wavelengths.

As means for making the above described typical optical transmission apparatus applicable to multiple wavelengths, for example, there is considered a method (i) as shown in the top part of FIG. 3 of changing the stable point for the wavelength by using an optical filter with a gentle slope for the transmission wavelength characteristic as the wavelength detection filter 31 and making the reference voltage Vref variable, or a method (ii) as shown in the bottom part of FIG. 3 of having stable points for a plurality of wavelengths at a fixed reference voltage Vref by using an optical filter with a periodic transmission wavelength characteristic as the wavelength detection filter 31.

Figure 4:
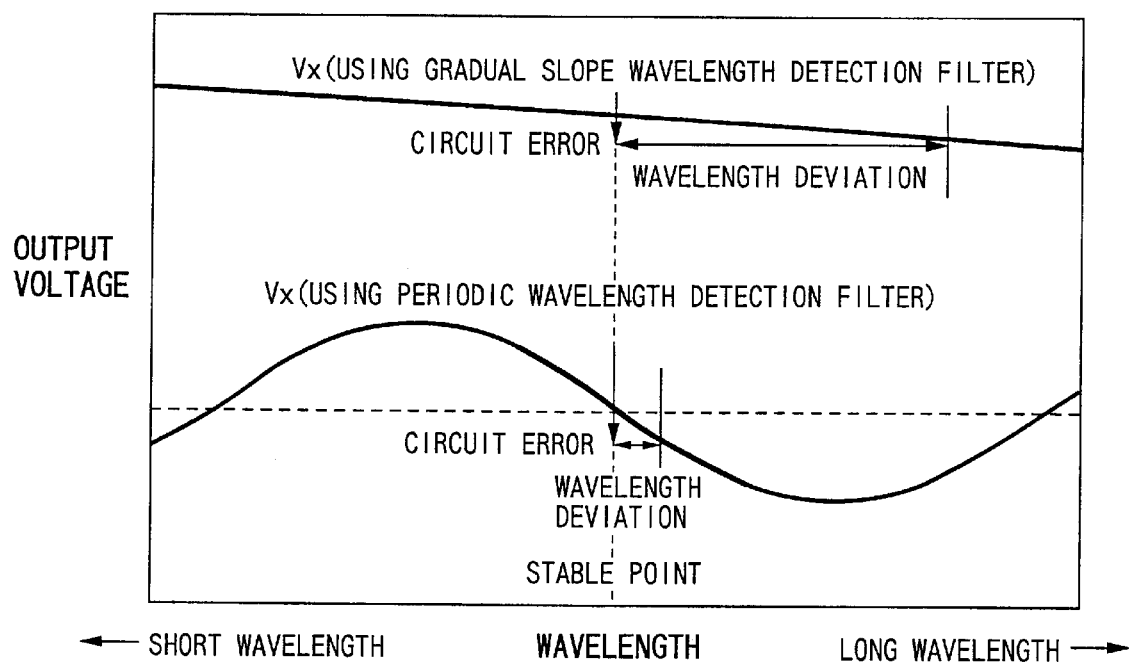
FIG. 4 is a diagram wherein wavelength deviations corresponding to circuit errors in the means shown in FIG. 3 are compared.

In the case of the abovementioned method (i), as shown in the top part of FIG. 4, a change amount of the output voltage Vx with respect to a change in the optical output wavelength is small. Therefore, a wavelength deviation due to circuit errors becomes large. However, in the case of method (ii), as shown in the bottom part of FIG. 4, the change amount of the output voltage Vx with respect to the change in the optical output wavelength is large. Therefore, the wavelength deviation due to circuit errors can be made small. Consequently, to perform the wavelength control with good accuracy, it is advantageous to apply method (ii).

To realize an optical transmission apparatus for multiple wavelengths using a wavelength detection filter with a periodic transmission wavelength characteristic, it is important: (1) to be able to set the target wavelength from the outside, (2) to not stabilize at the wrong wavelength and (3) to not influence on the other wavelengths. More specifically, in relation to (1), it is important that the target wavelength can be optionally set from stable points of a plurality of wavelengths, the setting efficiency for the stable points of the wavelength detection filter 31 is improved, and wavelength capture can be made at a high speed. Moreover, in relation to (2), it is important that for temporary wavelength drift with a time lapse of the LD 1, the wavelength corresponding to the stable point is not shifted to the other wavelength, and in relation to (3), that at a time of change of the wavelength setting, this change does not interfere with other wavelengths.

Hereunder embodiments of optical transmission apparatus according to the present invention will be specifically described, giving consideration to the abovementioned points.

Figure 5:
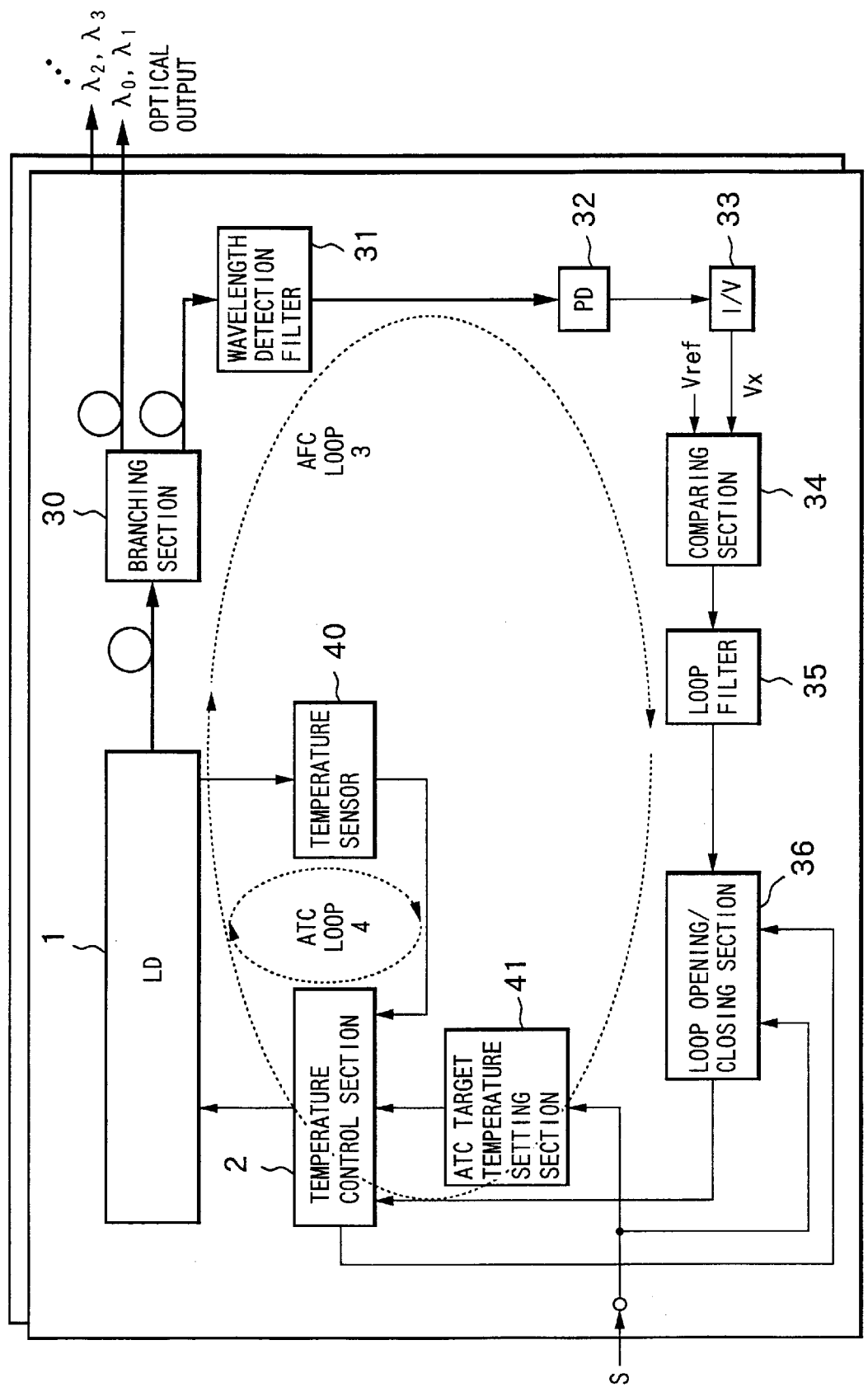
FIG. 5 is a block diagram showing a basic construction of a first embodiment according to the present invention.

FIG. 5 is a block diagram showing a basic construction of an optical transmission apparatus of a first embodiment. Parts similar to the construction of the abovementioned typical optical transmission apparatus shown in FIG. 1 are denoted by the same reference numerals, and the same applies hereunder.

In FIG. 5, this optical transmission apparatus uses an optical filter having a periodic transmission wavelength characteristic, as the wavelength detection filter 31 of the AFC loop 3 in the typical optical transmission apparatus of FIG. 1, and is additionally provided with an automatic temperature control loop 4 (hereunder ATC loop 4) for detecting the temperature of the LD 1 and sending the detection result to the temperature control section 2 to make the LD 1 constant at a required target temperature. Furthermore, this optical transmission apparatus is provided with a loop opening/closing section 36 inside the AFC loop 3, so that the opening and closing of the AFC loop is possible.

The ATC loop 4 comprises for example a temperature sensor 40 and an ATC target temperature setting section 41. The temperature sensor 40 detects the temperature of the LD 1 and sends the detection result to the temperature control section 2. The ATC target temperature setting section 41 sets, in the temperature control section 2, a target temperature of the LD 1 corresponding to a target wavelength indicated by a wavelength setting signal S supplied from the outside.

The loop opening/closing section 36 performs the opening and closing of the AFC loop 3 by means of a sequence circuit (not shown in the figure) in accordance with the wavelength setting signal S and a signal sent from the temperature control section 2. The specific construction of the sequence circuit is described later. By closing the loop opening/closing section 36, a signal which has passed through the loop filter 35 is transmitted to the temperature control section 2, and the temperature control of the LD 1 is performed based on the AFC. On the other hand, by opening the loop opening/closing section 36, the temperature control of the LD 1 is performed based on the ATC.

Figure 6:
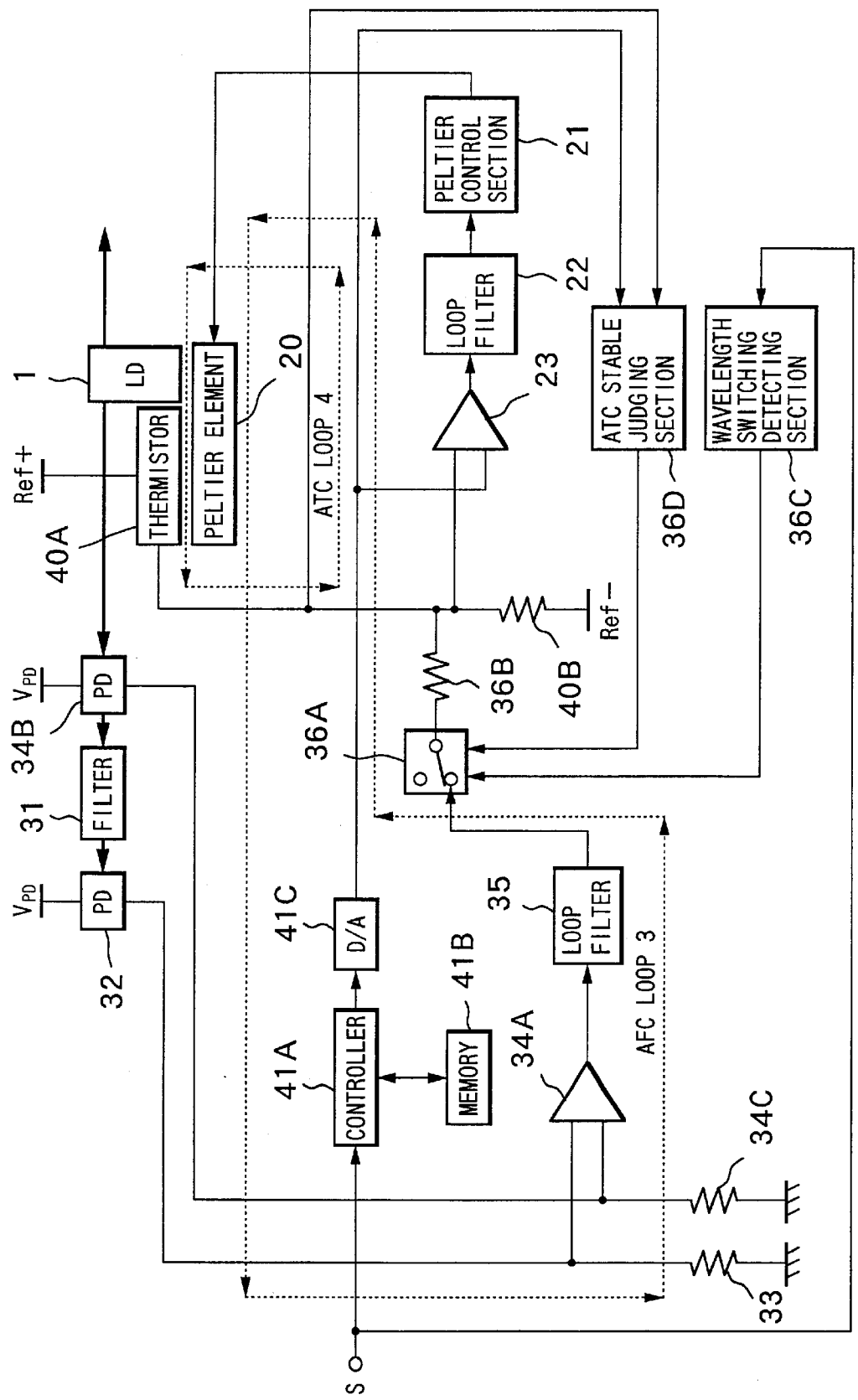
FIG. 6 is a diagram showing a specific circuit configuration example for the first embodiment.

FIG. 6 is a diagram showing a specific circuit configuration example for the first embodiment.

A circuit configuration equivalent to the abovementioned temperature control section 2, comprises a Peltier element 20, a Peltier control section 21, a loop filter 22 and a comparator 23. Furthermore, a circuit configuration equivalent to the temperature sensor 40 constituting the ATC loop 4 comprises a thermistor 40A and a resistor 40B, and a circuit configuration equivalent to the ATC target temperature setting section 41 comprises a controller 41A, a memory 41B and a D/A converter 41C.

The Peltier element 20 is a device that generates or absorbs heat depending on a current supplied from the Peltier control section 21, to thereby adjust the temperature of the mounted LD 1. The Peltier control section 21 generates a current corresponding to an output signal from the comparator 23 sent via the loop filter 22. The loop filter 22 is a circuit having a necessary time constant so that the temperature control of the LD 1 is performed stably. The comparator 23 is applied with a voltage between the thermistor 40A and the resistor 40B to one input terminal thereof, and is applied with an output voltage from the ATC target temperature setting section 41 to the other input terminal thereof, to output a signal corresponding to a difference of these voltage levels to the loop filter 22.

The thermistor 40A and the resistor 40B are connected in series between positive and negative power terminals Ref+ and Ref−. The thermistor 40A is mounted on the Peltier element 20, and the resistance value thereof is changed in accordance with the temperature of the LD 1. As a result, a voltage level of the connection point of the termistor 40A with the resistor 40B is changed corresponding to the temperature of the LD 1.

The controller 41A, on input of the wavelength setting signal S supplied from the outside, judges a target wavelength to be set by this wavelength setting signal S, and reads out from the memory 41B a target temperature of the ATC corresponding to this target wavelength, to output to the D/A converter 41C. The D/A converter 41C converts a digital signal from the controller 41 A to an analog signal, to output to the comparator 23 and an ATC stable judging section 36D.

In a circuit configuration forming the AFC loop 3, here return light emitted from the rear face of the LD 1 is sent via a transmission type PD 34B to the wavelength detection filter 31 having a periodic wavelength characteristic such as for example an etalon, and the light which has been transmitted through the wavelength detection filter 31 is received by the PD 32, and the current generated by the PD 32 is converted to a voltage by a resistor 33 serving as an I/V conversion section. Here, by using the return light of the LD 1, the construction corresponding to the branching section 30 can be omitted. The circuit configuration corresponding to the comparing section 34 comprises a comparator 34A, the transmission type PD 34B, and a resistor 34C. The transmission type PD 34B receives the light before being input to the wavelength detection filter 31, to generate a current corresponding to the output light power from the LD 1. The current from the transmission type PD 34B is converted to a voltage by the resistor 34C. The comparator 34A is applied with a voltage between the PD 32 and the resistor 33 as the output voltage Vx to one input terminal thereof, and a voltage between the transmission type PD 34B and the resistor 34C as the reference voltage Vref to the other input terminal thereof, to send a signal corresponding to a difference between these voltage levels to the loop filter 35. The loop filter 35 is a circuit having a necessary time constant so that the temperature control of the LD 1 based on the AFC loop 3 can be performed stably.

A circuit configuration equivalent to the loop opening/closing section 36 comprises a switch 36A, a resistor 36B, a wavelength switching detecting section 36C and the ATC stable judging section 36D. The switch 36A incorporates for example a register therein, and performs a switching operation in accordance with signals respectively sent from the ATC stable judging section 36D and the wavelength switching detecting section 36C. When the switch 36A is switched to ON, the voltage signal output from the loop filter 35 is applied to a node between the thermistor 40A and the resistor 40B via the resistor 36B. The wavelength switching detecting section 36C detects a change in the wavelength setting signal S supplied from the outside, to send to the switch 36A a signal notifying that the setting of the wavelength has been switched. The ATC stable judging section 36D, based on the voltage between the thermistor 40A and the resistor 40B and the output voltage from the ATC target temperature setting section 41, judges whether or not the control operation of the ATC has stabilized and the temperature of the LD 1 has become constant in the vicinity of the target temperature, to send the judgment result to the switch 36A.

Next is a description of the operation of the first embodiment.

Figure 7:
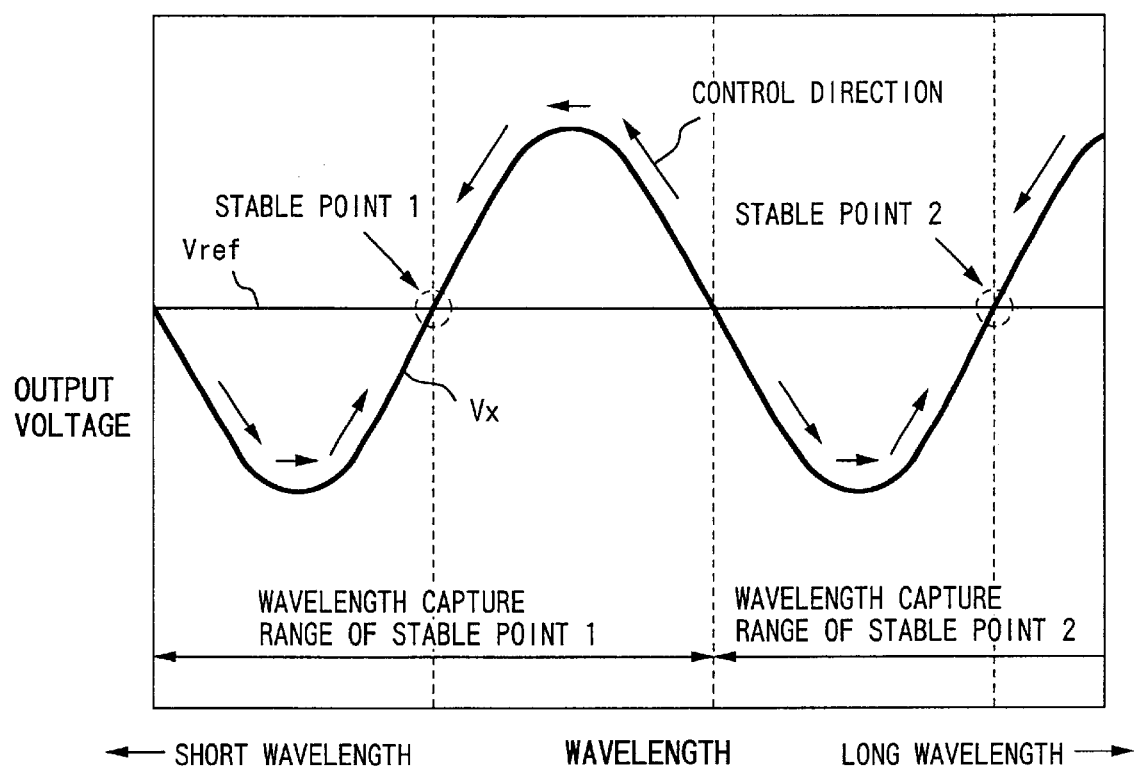
FIG. 7 is a diagram for generally describing a basic operation of the first embodiment.

At first, a brief explanation of a specific operation of the present apparatus is given here. An optical filter having a periodic transmission wavelength characteristic is applied as the wavelength detection filter 31, so that for example as shown in FIG. 7, stable points of the wavelength control by the AFC loop 3 are multiply present (in the figure, two stable points 1, 2), and the respective stable points 1, 2 have control capable ranges (wavelength capture ranges) respectively.

Actual stable points of the wavelength control are determined depending on which of the capture ranges of the wavelength stable points the optical output wavelength at commencement of wavelength control is within. However, since the wavelength at the starting of the apparatus differs due to the ambient temperature of the LD 1, if the temperature of the LD 1 is not controlled to be stable, the wavelength stable point of AFC operation becomes indefinite. Therefore, it is necessary to control the wavelength at commencement of AFC control, to be within the wavelength capture range of the target wavelength. In the present embodiment, as the preliminary operation for wavelength capture, the temperature control of the LD 1 is executed by the ATC loop 4.

Figure 8:
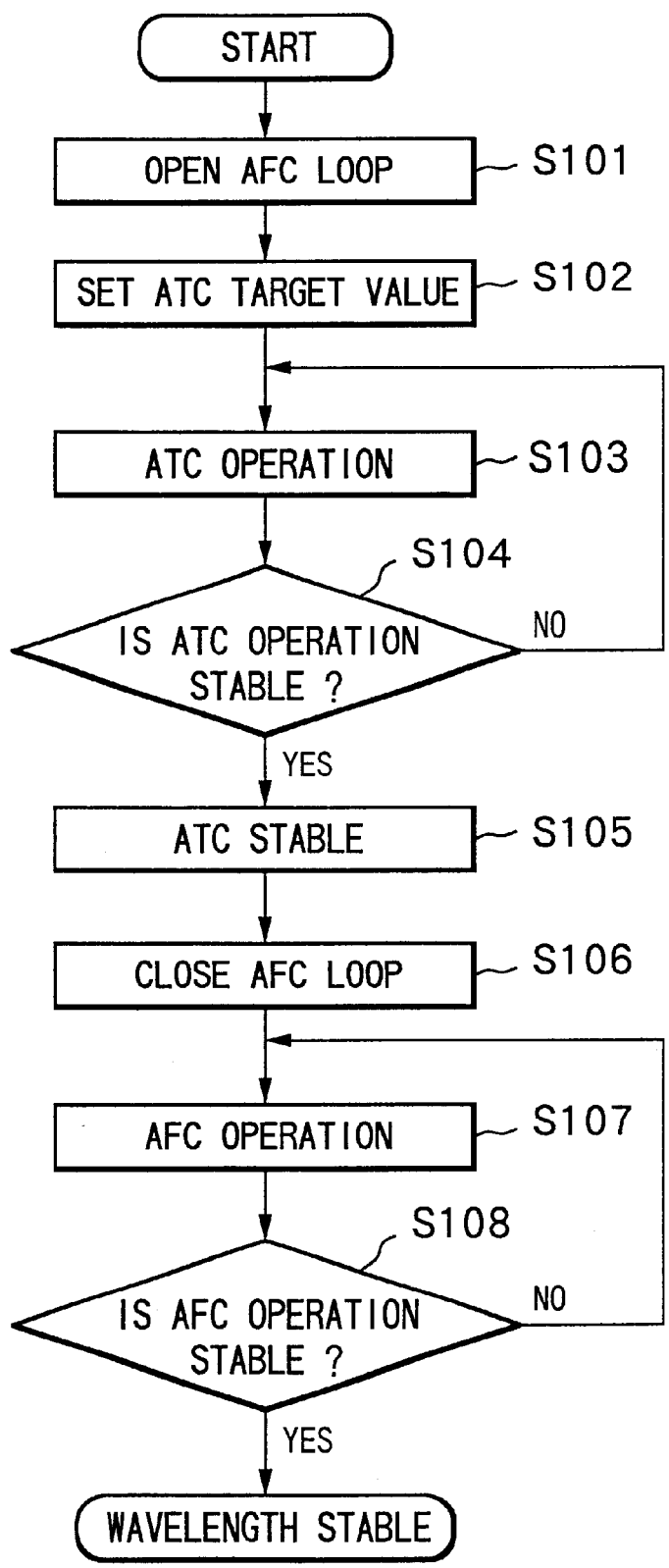
FIG. 8 is a flow chart showing an operation at a starting time of the first embodiment.

Here the operation during starting of the present apparatus is specifically described using a flow chart of FIG. 8.

In FIG. 8, when the present apparatus is started and the wavelength setting signal S is applied from outside, in step 101 (denoted as S101 in the figure and similarly for subsequent steps), the wavelength switching detecting section 36C detects the change in the wavelength setting signal S, to output a control signal for switching OFF the switch 36A, so that the AFC loop 3 becomes an open loop. Furthermore, simultaneously with this, in step 102, the controller 41A judges the target wavelength set by the wavelength setting signal S and reads out from the memory 41B a corresponding target temperature for the ATC, to output a voltage signal corresponding to this target temperature via the D/A converter 41C to the comparator 23 and the ATC stable judging section 36D. As a result, in step 103, the control operation for stabilizing the temperature of the LD 1 at the target temperature is started by the ATC loop 4.

Figure 9:
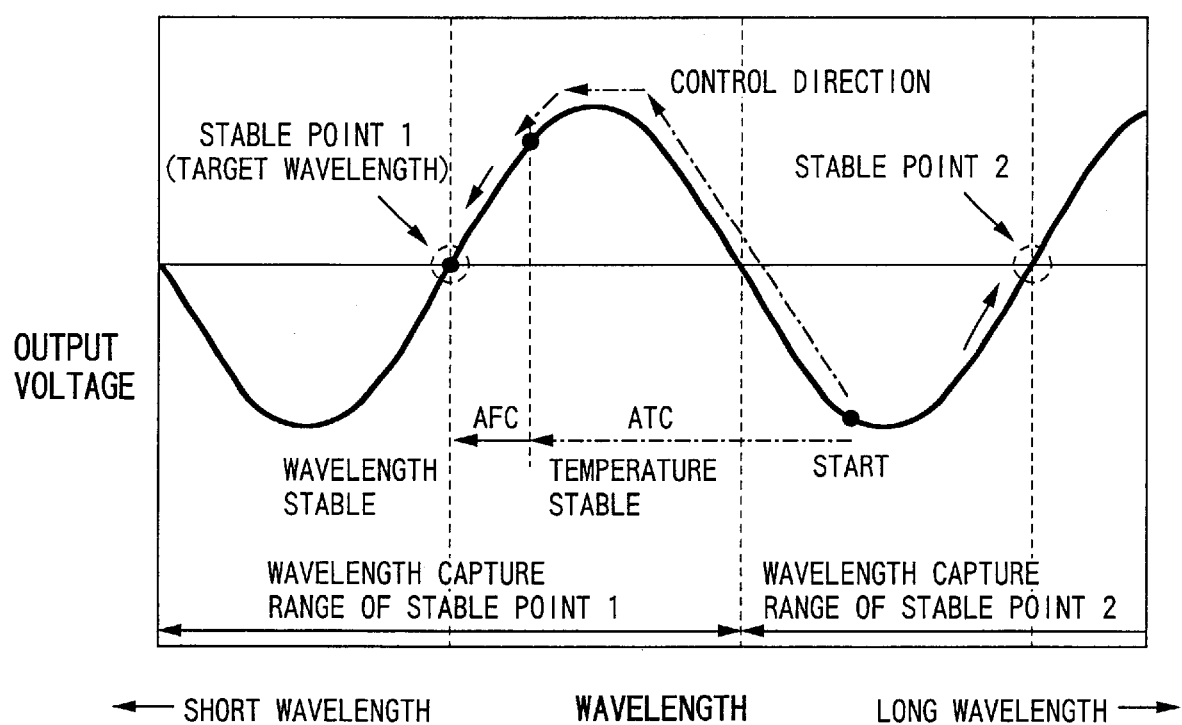
FIG. 9 is a diagram for explaining a control operation at the starting time of the first embodiment.

In this control operation by the ATC loop 4, for example as shown in FIG. 9, in the case where the target wavelength is set at a wavelength corresponding to the stable point 1, when the wavelength corresponding to the temperature of the LD 1 at the starting of the apparatus is within the wavelength capture range of the stable point 2, a control is performed to change the temperature of the LD 1, to shift the wavelength to the short wavelength side so as to be within the wavelength capture range of the stable point 1.

In the specific ATC operation, the voltage level of the connection point between the thermistor 40A for which the resistance value is changed corresponding to the temperature of the LD 1, and the resistor 40B is input to the comparator 23, and a signal corresponding to a difference to the voltage level corresponding to the target temperature is output from the comparator 23 via the loop filter 22 to the Peltier control section 21. The Peltier control section 21 controls the operation of the Peltier element 20 in accordance with the signal from the loop filter 22 so that the temperature of the LD 1 becomes stable at the target temperature.

Then, in step 104, in the ATC stable judging section 36D, based on the voltage between the thermistor 40A and the resistor 40B, and the output voltage from the ATC target temperature setting section 41, it is judged whether or not the temperature of the LD 1 becomes in the vicinity of the target temperature, resulted in the stabilization of the ATC operation. When judged that the ATC operation has stabilized, control proceeds to step 105 where the ATC stable judging section 36D outputs a signal for switching the switch 36A from OFF to ON. Then in step 106, with the switching ON of the switch 36A, the AFC loop 3 becomes a closed loop, and in step 107, the AFC operation is started, to perform the control operation for capturing the optical output wavelength of the LD 1 to the target wavelength.

In the control operation by this AFC loop 3, specifically, the voltage Vx at the connection point between the PD 32 and the resistor 33, and the reference voltage Vref at the connection point between the transmission type PD 34B and the resistor 34C are input to the comparator 34A, and the output voltage corresponding to the difference between these voltages Vx and Vref is applied, via the loop filter 35, the switch 36A and the resistor 36B, to the connection point between the thermistor 40A and the resistor 40B. As a result, the voltage level applied to one input terminal of the comparator 23 is changed corresponding to the output voltage of the comparator 34A of the AFC loop 3, so that the output voltage Vx becomes equal to the reference voltage Vref. That is, as shown in FIG. 9, the temperature of the LD 1 is feedback controlled so that the optical output wavelength of the LD 1 coincides with the target wavelength corresponding to the stable point 1.

Then, in step 108, it is judged whether or not the AFC operation has stabilized and the optical output wavelength of the LD 1 has been captured to the target wavelength. When judged that the AFC operation has stabilized, the control operation at the starting of the present apparatus is terminated and a normal operation is performed.

Figure 10:
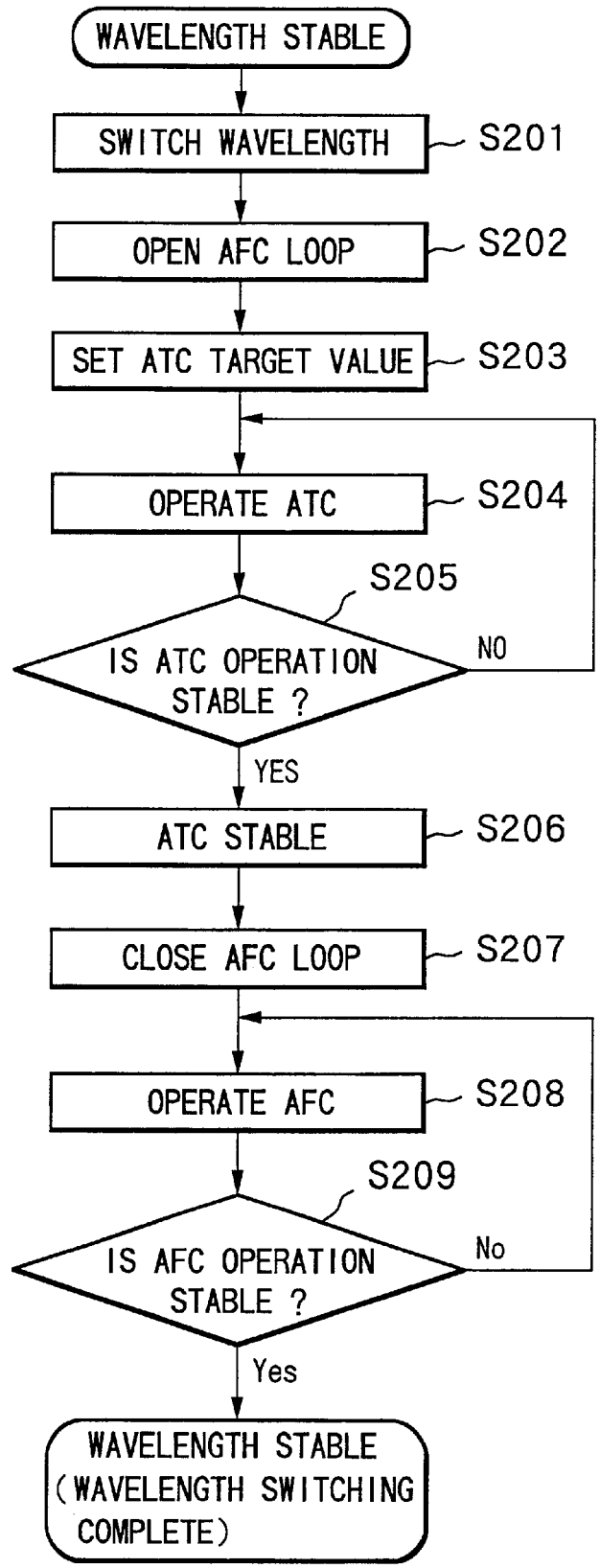
FIG. 10 is a flow chart showing an operation at a time of wavelength switching of the first embodiment.

Next, the operation of the present apparatus at the wavelength switching will be specifically described using a flow chart of FIG. 10.

In FIG. 10, in step 201, when a command for switching the setting of the target wavelength from the wavelength corresponding to the stable point 1 to the wavelength corresponding to the stable point 2 is supplied from the outside by the wavelength setting signal S, then in step 202, the wavelength switching detecting section 36C detects the change in the wavelength setting signal S, to output a control signal for switching the switch 36A OFF, so that the AFC loop 3 becomes an open loop. Furthermore, simultaneously with this, in step 203, the controller 41A judges the target wavelength set by the wavelength setting signal S and reads out from the memory 41B a corresponding target temperature for the ATC, to output a voltage signal corresponding to this target temperature via the D/A converter 41C to the comparator 23 and the ATC stable judging section 36D. As a result, in step 204, the control operation for stabilizing the temperature of the LD 1 at the target temperature is started by the ATC loop 4.

Figure 11:
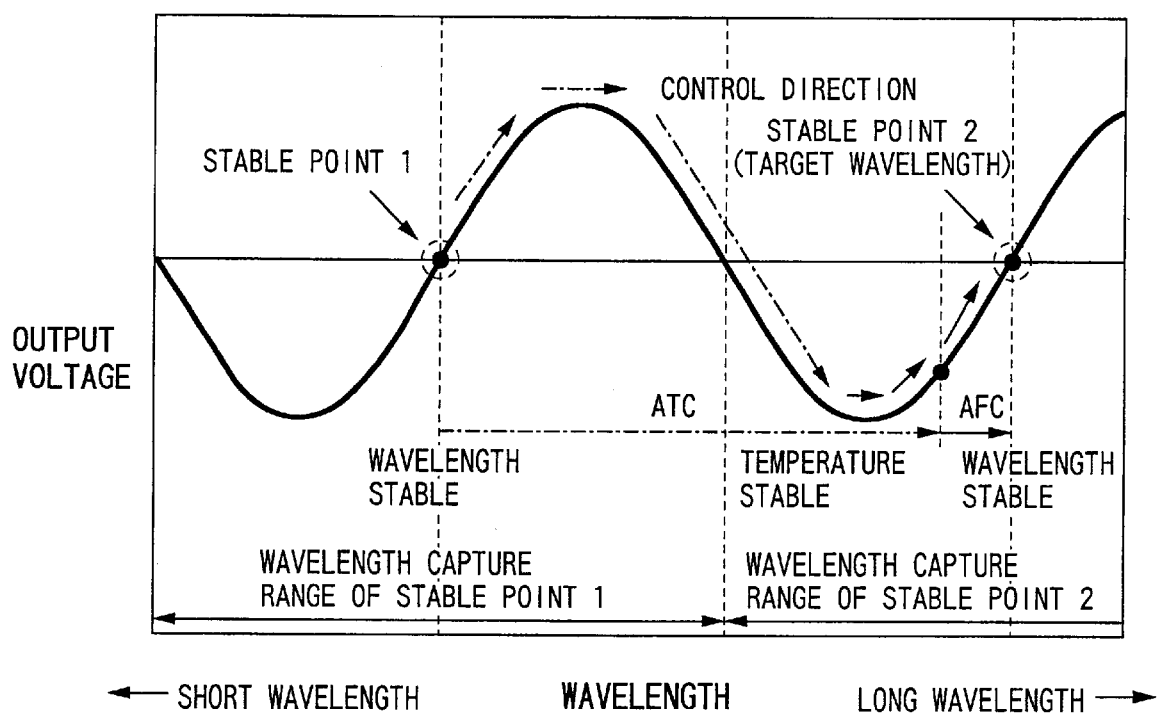
FIG. 11 is a diagram for explaining a control operation at the time of wavelength switching of the first embodiment.

In this control operation by the ATC loop 4, for example as shown in FIG. 11, a control is performed to change the temperature of the LD 1, to shift the optical output wavelength controlled to the wavelength corresponding to the stable point 1 to the long wavelength side so as to be within the wavelength capture range of the stable point 2. The specific ATC operation is the same as for the aforementioned operation at the starting of the apparatus.

Then, in step 205, in the ATC stable judging section 36D, it is judged whether or not the ATC operation has stabilized, and if judged that the ATC operation has stabilized, control proceeds to step 206 where the ATC stable judging section 36D outputs a signal for switching the switch 36A from OFF to ON. Then in step 207, with the switching ON of the switch 36A, the AFC loop 3 becomes a closed loop, and in step 208 the AFC operation is started, to perform the control operation for capturing the optical output wavelength of the LD 1 to the target wavelength (corresponding to the stable point 2). The control operation by this AFC loop 3 is the same as for the aforementioned operation at the starting of the apparatus. Then, in step 209, it is judged whether or not the AFC operation has stabilized and the optical output wavelength of the LD 1 has been captured to the target wavelength. When judged that the AFC operation has stabilized, the control operation at the wavelength switching of the apparatus is terminated and again the normal operation is performed.

In this manner, according to the first embodiment, by using an optical fiber having a periodic transmission wavelength characteristic as the wavelength detection filter of the AFC loop 3, and by making it possible to select the setting of the target wavelength by the wavelength setting signal S supplied from the outside, it becomes possible to appropriately switch the optical output wavelength of the LD 1 to a wavelength corresponding to the stable point 1 or the stable point 2. Therefore an optical transmission apparatus for multiple wavelengths (here for two wavelengths) can be realized. By realizing an optical transmission apparatus for multiple wavelengths in this manner, common use of optical parts and simplification of a backup configuration can be achieved, so that an improvement in manufacturability and a reduction in cost can be realized. Furthermore, expandability on the user side, such as modification of wavelengths, can also be improved.

In the first embodiment, the case has been described for where the wavelength stable point can be doubly set. However as also shown at the bottom part of FIG. 3 mentioned before, three or more stable points corresponding to the periodicity of the wavelength detection filter can also be easily set.

Next is a description of an optical transmission apparatus of a second embodiment.

Figure 12:
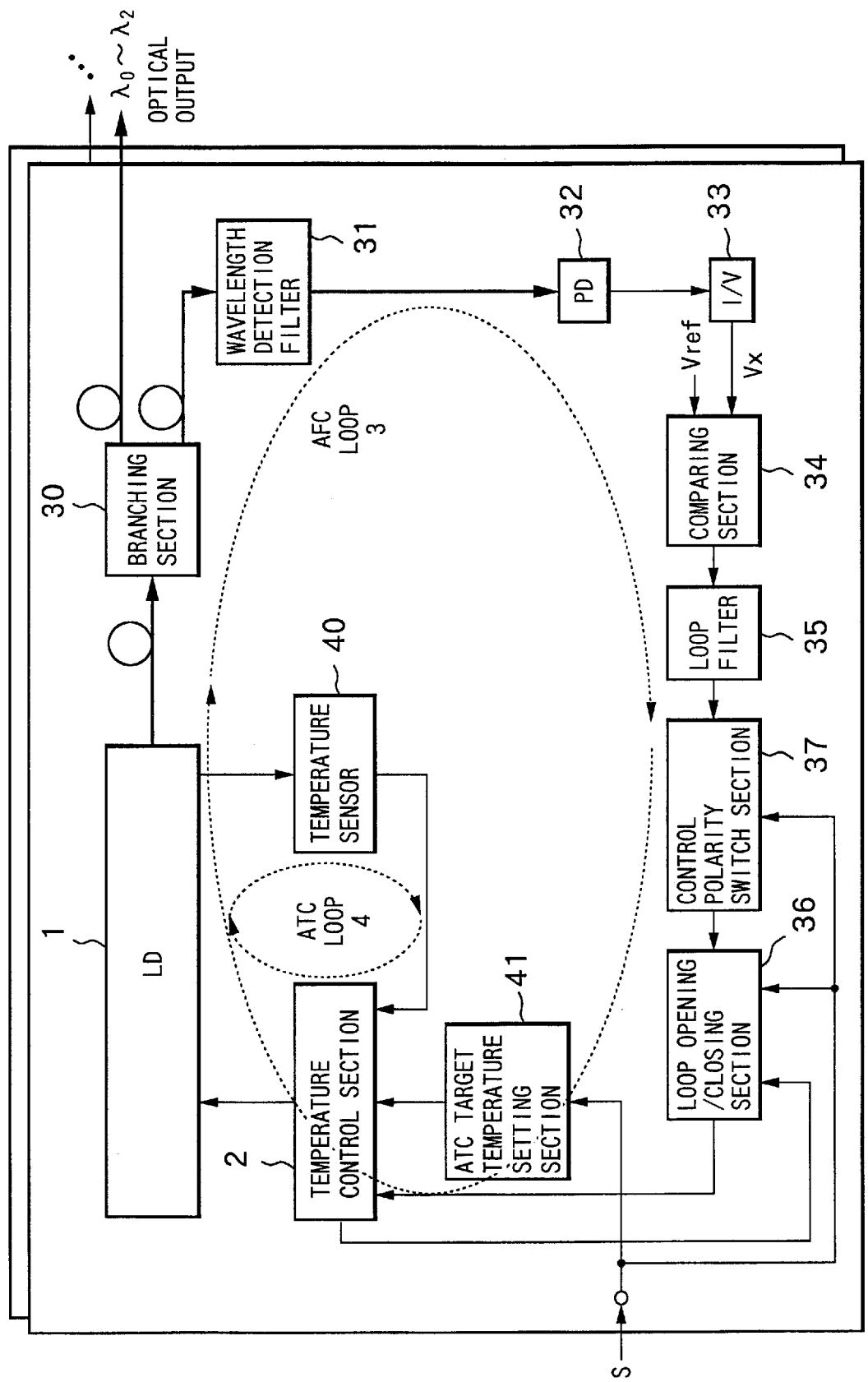
FIG. 12 is a block diagram showing a basic construction of a second embodiment according to the present invention.

FIG. 12 is a block diagram showing a basic construction of the optical transmission apparatus of the second embodiment.

In FIG. 12, the part where the construction of this apparatus is different from the construction of the first embodiment is that a control polarity switch section 37 is provided inside the AFC loop 3. The construction of the other parts is the same as for the case of the first embodiment, and therefore the description thereof is omitted.

Figure 13:
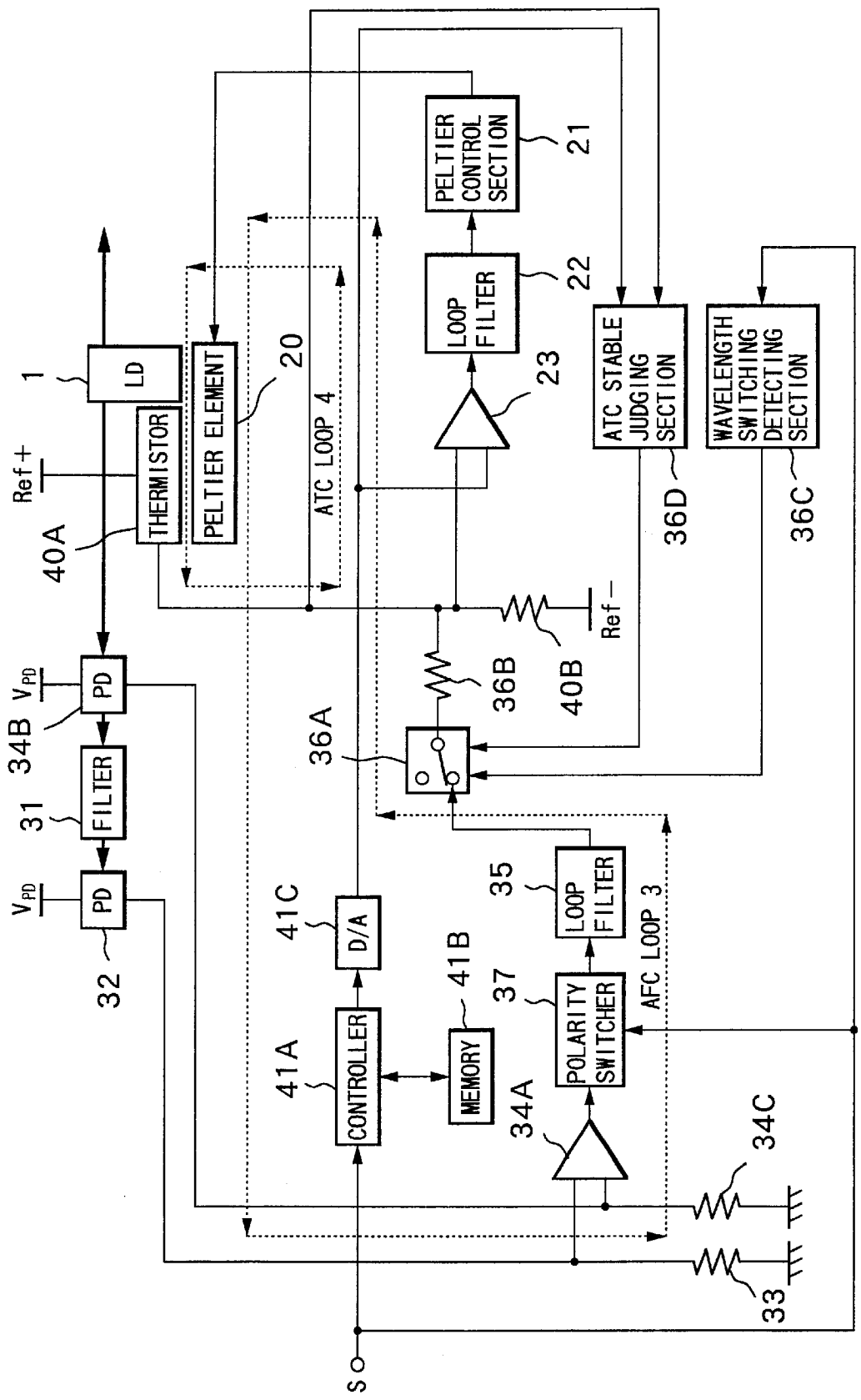
FIG. 13 is a diagram showing a specific circuit configuration example for the second embodiment.

The control polarity switch section 37 is here inserted for example between the loop filter 35 and the loop opening/closing section 36, and has a function for switching the polarity of the AFC operation (the direction of wavelength capture control), depending on the wavelength setting signal S. FIG. 13, as with the aforementioned case of FIG. 6, shows a specific circuit configuration example of the second embodiment. In this configuration example, a polarity switcher 37 is provided between the comparator 34A of the AFC loop 3 and the loop filter 35. The polarity switcher 37 is assumed to execute the switching of the control polarity such as by judging if the target wavelength indicated by the wavelength setting signal S is a wavelength corresponding to an odd number channel or a wavelength w corresponding to an even number channel.

Figure 14:
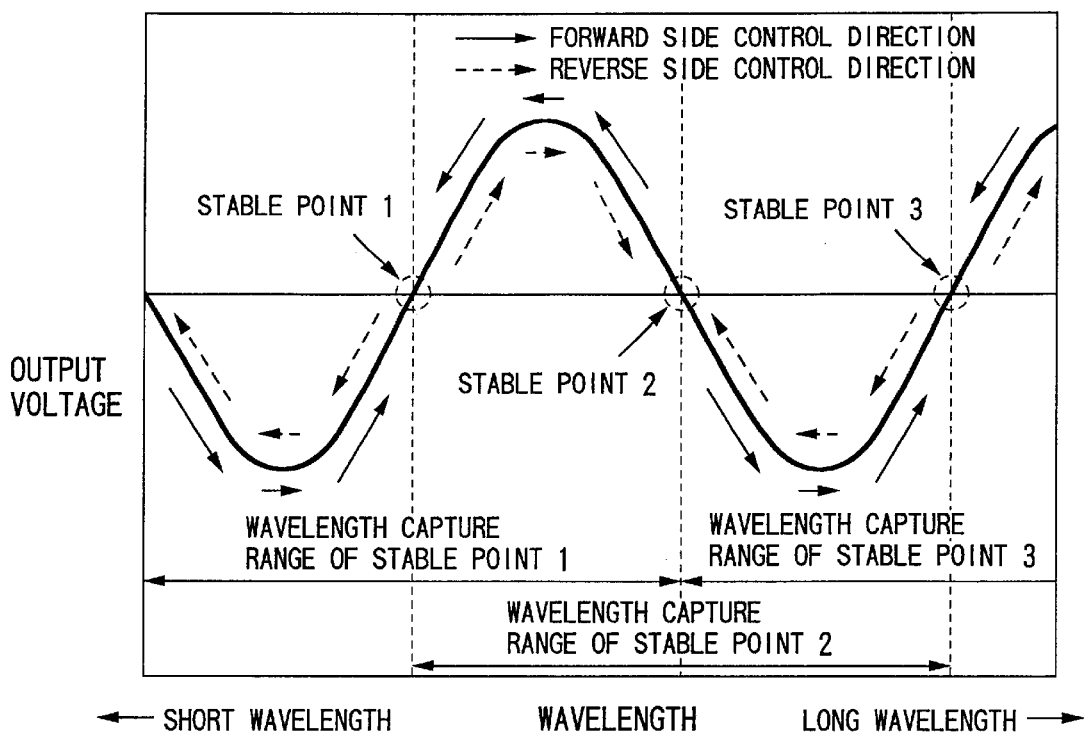
FIG. 14 is a diagram for explaining a basic operation of the second embodiment.

In the optical transmission apparatus of such a construction, as shown in FIG. 14, the target wavelength of the wavelength control by the AFC loop 3 is set to correspond to three stable points 1~3. The stable point 1 and the stable point 3 are the intersection point of the output voltage Vx corresponding to the rightward rising slope portion of the periodic transmission wavelength characteristic of the wavelength detection filter 31 and the constant reference voltage Vref. The stable point 2 is the intersection point of the output voltage Vx corresponding to the rightward falling slope portion of the periodic transmission wavelength characteristic of the wavelength detection filter 31 and the reference voltage Vref.

The control direction of the AFC, in the case where the target wavelength is set to a wavelength corresponding to the stable point 1 or the stable point 3 (the polarity in this case is a forward side, and this control direction is shown by the solid line arrows in FIG. 14), is such that the temperature of the LD 1 is controlled so that the optical output wavelength is shifted to the short wavelength side when the output voltage Vx is higher than the reference voltage Vref (Vx>Vref), while the temperature of the LD 1 is controlled so that the optical output wavelength is shifted to the long wavelength side when the output voltage Vx is lower than the reference voltage Vref (Vx<Vref). On the other hand, in the case where the target wavelength is set to a wavelength corresponding to the stable point 2 (the polarity in this case is a reverse side, and this control direction is shown by the broken line arrows in FIG. 14), the temperature of the LD 1 is controlled so that the optical output wavelength is shifted to the long wavelength side when the output voltage Vx is higher than the reference voltage Vref (Vx>Vref), while the temperature of the LD 1 is controlled so that the optical output wavelength is shifted to the short wavelength side when the output voltage Vx is lower than the reference voltage Vref (Vx<Vref).

The operation of this apparatus at the starting and at the wavelength switching, except for the point where the control direction of the AFC is switched as described above by the polarity switcher 37 corresponding to the wavelength setting signal S, is the same as the operation for the case of the first embodiment, and hence specific description is omitted.

In this manner according to the second embodiment, by adding the polarity switcher 37 to the AFC loop 3 so that the polarity (control direction) of the wavelength control can be switched corresponding to the target wavelength, it becomes possible to make best use of the rightward rising slope portion and the rightward falling slope portion in the transmission wavelength characteristic of the wavelength detection filter 31. Therefore, for example when considering a case where the wavelength detection filter 31 having a periodic wavelength characteristic as with the case of the first example is used, the stable points of the wavelength control can be doubled. As a result, it becomes possible to improve the setting efficiency for the stable points of the wavelength detection filter 31.

Figure 15:
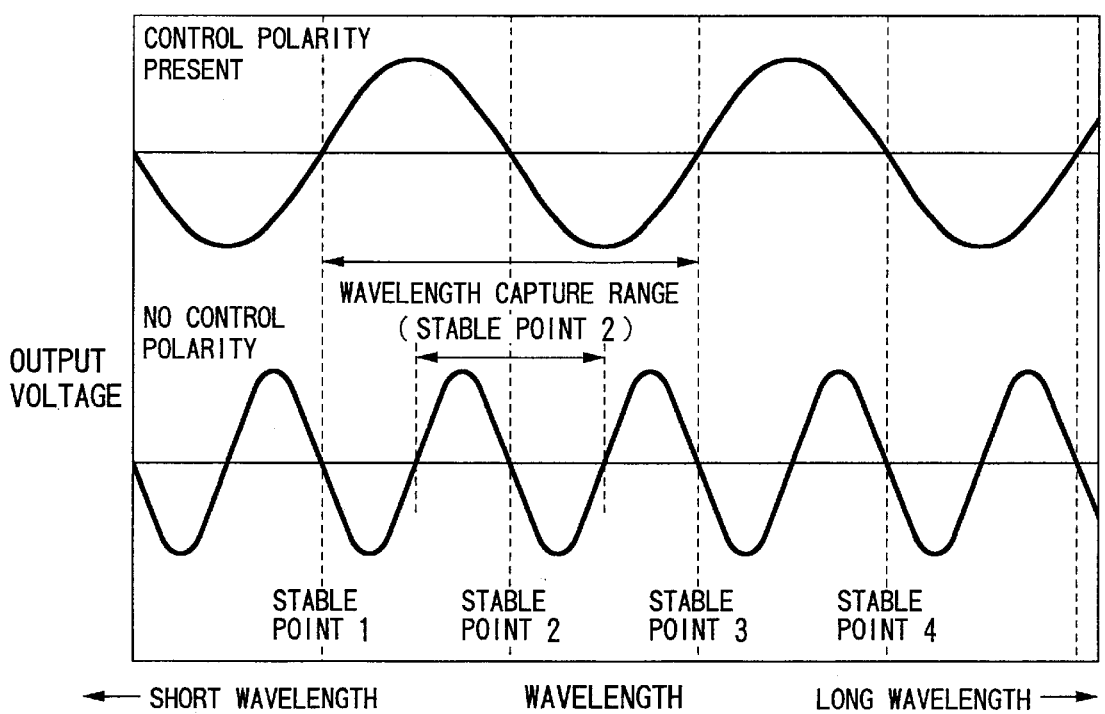
FIG. 15 is a diagram for explaining an effect owing to switching of polarity in the second embodiment.

Furthermore, considering a case where the optical transmission apparatus of the present invention is used in a system requiring multiple wavelength stable points with inter-wavelength spacing uniform, when the polarity of the AFC is limited to one direction as with the case of the first embodiment, the inter-wavelength spacing and the period of the wavelength detection filter 31 coincide with each other. In comparison to this, when the polarity of the AFC is switched to two directions as with the case of the second embodiment, the inter-wavelength spacing and the half period of the wavelength detection filter 31 coincide with each other. This means that, as shown in FIG. 15, the wavelength capture range for the AFC loop 3 in the case where the polarity switching is performed (the top part in the figure) becomes twice the wavelength capture range for the case where the polarity switching is not performed (the bottom part in the figure). By making it possible to widely set the wavelength capture range with respect to a single stable point, there is also the effect that the time required for the preliminary wavelength (temperature) control operation by the ATC loop 4 before starting the AFC operation can be shortened.

Next is a description of an optical transmission apparatus of a third embodiment.

In the abovementioned first and second embodiments, the AFC loop 3 and the ATC loop 4 are multiple loops for the temperature control section 2 that performs the temperature control of the LD 1. Therefore, the time constant for the loop filter 35 of the AFC must be delayed sufficiently with respect to the time constant for the loop filter 22 of the ATC so that the respective control operations of the AFC and the ATC do not interfere with each other. Hence, a comparatively long time is required until the optical output wavelength is stabilized. Therefore, in the third embodiment, a description is given of an improved optical transmission apparatus wherein the time until the wavelength stabilization is shortened.

Figure 16:
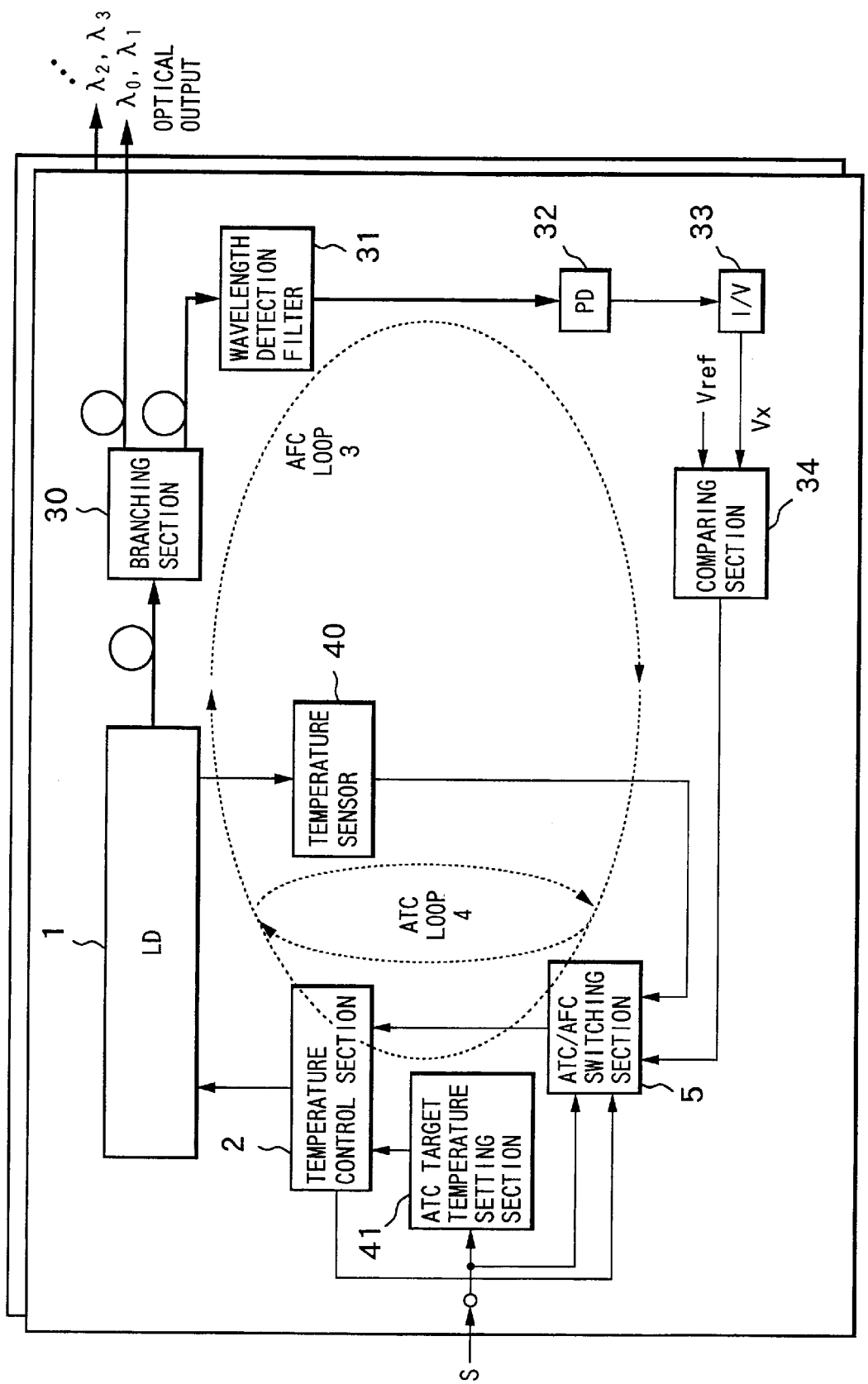
FIG. 16 is a block diagram showing a basic construction of a third embodiment according to the present invention.

FIG. 16 is a block diagram showing a basic construction of the optical transmission apparatus of the third embodiment.

In FIG. 16, this apparatus is provided with an ATC/AFC switching section 5 as control loop switching means instead of the loop filter 35 and the loop opening/closing section 36 constituting the AFC loop 3 in the construction of for example the first embodiment (refer to FIG. 5). Construction other than this is the same as that of the first embodiment.

The ATC/AFC switching section 5 is input with the signal output from the comparing section 34 of the AFC loop 3 and the signal output from the temperature sensor 40 of the ATC loop 4, and based on the wavelength setting signal S from the outside and the signal from the temperature control section 2, selects either one of the two input signals to output the selected signal to the temperature control section 2. By providing this ATC/AFC switching section 5, the AFC loop 3 and the ATC loop 4 are no longer multiple loops, and hence the respective loop filters of the AFC and the ATC can be made common.

Figure 17:
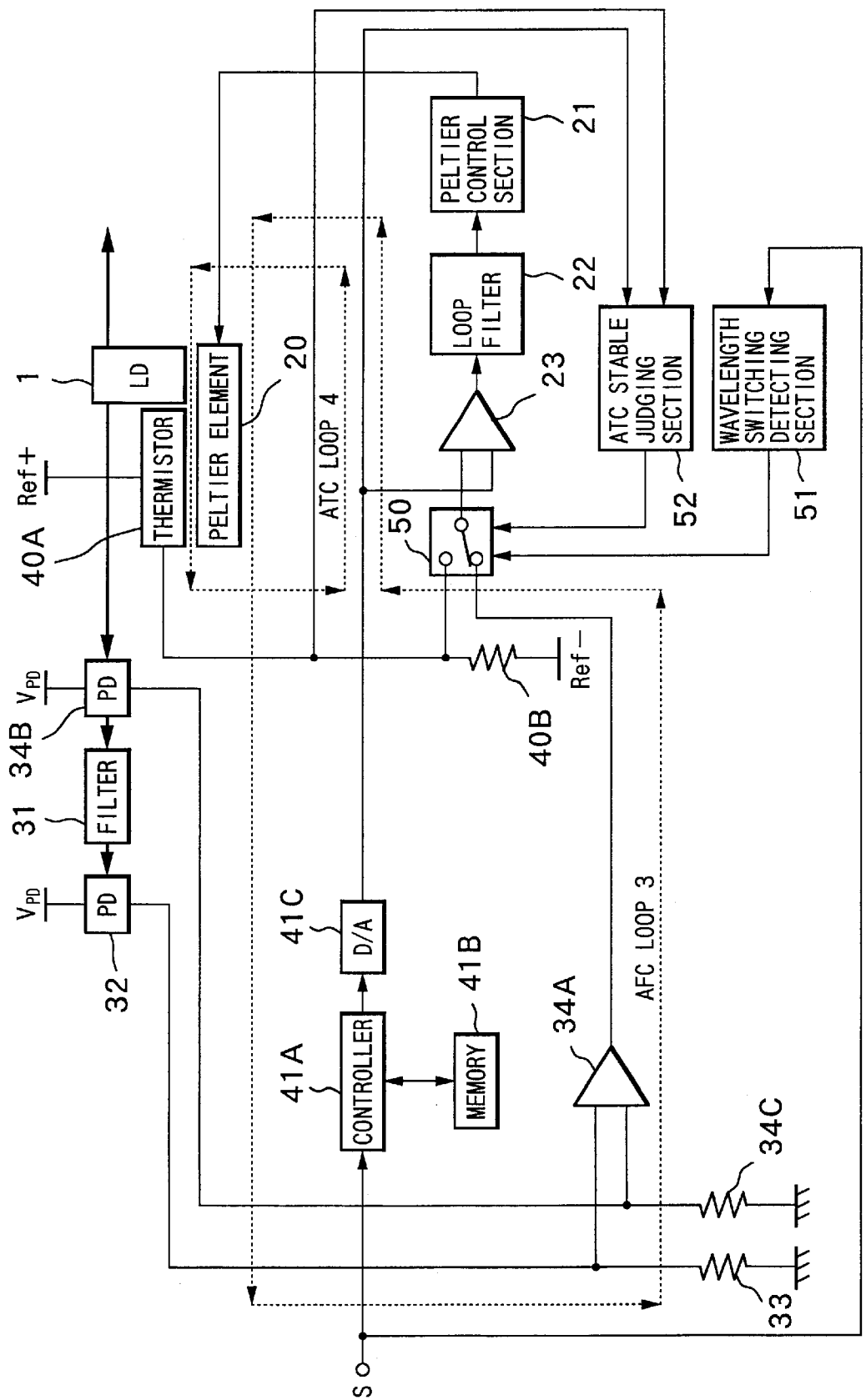
FIG. 17 is a diagram showing a specific circuit configuration example for the third embodiment.

FIG. 17 is a diagram showing a specific circuit configuration example for the third embodiment.

In the configuration example of FIG. 17, for the circuit configuration corresponding to the aforementioned ATC/AFC switching section 5, there is provided a switch 50, a wavelength switching detecting section 51 and an ATC stable judging section 52. The switch 50 has two input terminals. To one of the input terminals is applied the voltage at the connection point between the thermistor 40A and the resistor 40B, and to the other input terminal is applied the output voltage from the comparator 34A of the AFC loop 3. According to respective signals output from the wavelength switching detecting section 51 and the ATC stable judging section 52, either one of these input terminals is connected to an output terminal and the voltage signal is output to the comparator 23. The wavelength switching detecting section 51 which is the same as the wavelength switching detecting section 36C used in the first embodiment, detects a change in the wavelength setting signal S supplied from the outside, to send to the switch 50 a signal notifying that the setting of the wavelength has been switched. Furthermore, the ATC stable judging section 52 which is also the same as the ATC stable judging section 36D used in the first embodiment, based on the voltage between the thermistor 40A and the resistor 40B and the output voltage from the ATC target temperature setting section 41, judges whether or not the control operation of the ATC has stabilized and the temperature of the LD 1 has become constant in the vicinity of the target temperature, to send this judgment result to the switch 50.

The operation of the third embodiment of such a construction will now be described in accordance with the time chart of FIG. 18.

Figure 18:
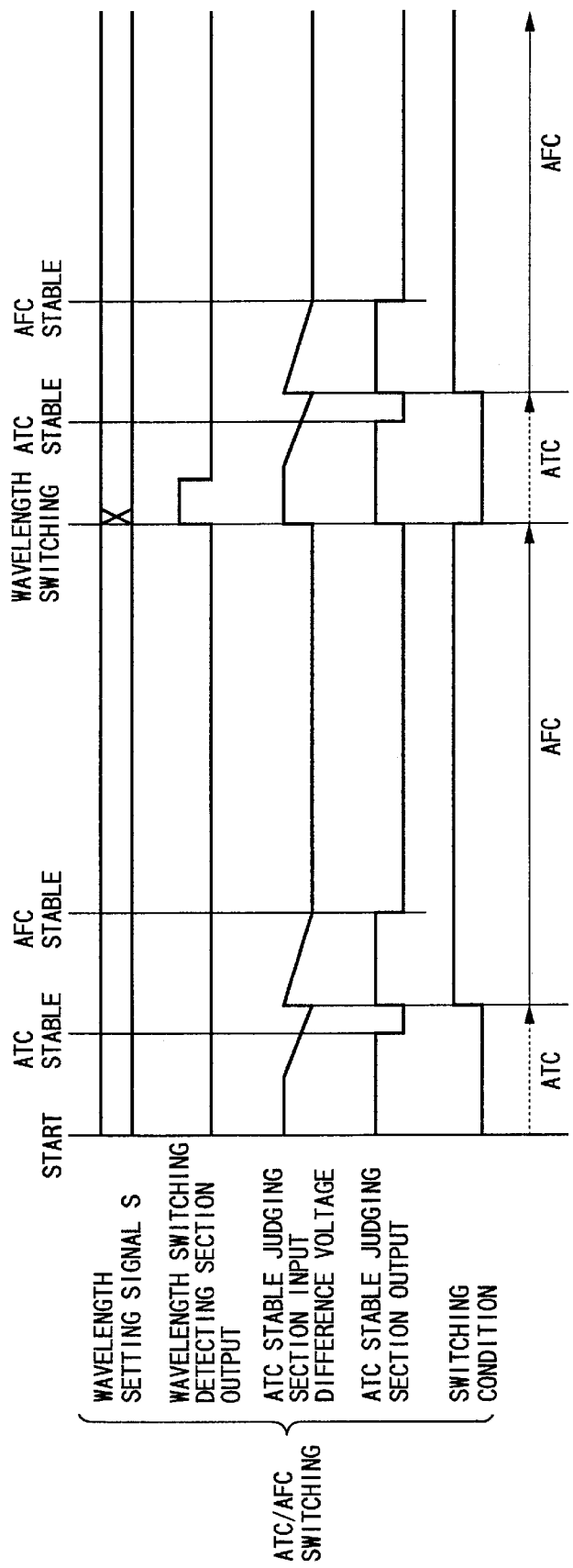
FIG. 18 is a flow chart showing an operation of the third embodiment.

As shown in FIG. 18, when the temperature of the LD 1 is deviated from the target temperature of the ATC due to start-up of the present apparatus, the output voltage from the comparator 23 and the output signal from the ATC stable judging section 52 both become a high level. As a result, the switch 50 performs a switching operation so as to select the ATC loop 4 side (the input terminal applied with the voltage between the thermistor 40A and the resistor 40B) (in the figure this condition is shown as a low level), so that the temperature control of the LD 1 is started by the ATC, and an input difference voltage of the ATC stable judging section 52 is gradually reduced. Then, when the temperature of the LD 1 is controlled to near the target temperature and the ATC operation is stabilized, the output signal from the ATC stable judging section 52 becomes a low level. On receipt of the low level output signal from the ATC stable judging section 52, the switch 50 performs the switching operation so as to select the AFC loop 3 side (the input terminal applied with the output voltage from the comparator 34A) (in the figure this condition is shown as a high level), and the temperature control of the LD 1 by the AFC is started. Immediately after starting the AFC operation, the output voltage from the comparator 23 and the output signal from the ATC stable judging section 52 both become a high level, and with continuation of the AFC operation, the input difference voltage of the ATC stable judging section 52 is gradually reduced, and the optical output wavelength of the LD 1 becomes stable at the target wavelength.

Then, when the switching of the target wavelength is indicated by the wavelength setting signal S, the output signal from the wavelength switching detecting section 51 which has detected a change in the wavelength setting signal S and the output signal from the ATC stable judging section 52 both become a high level. As a result, the switch 50 performs the switching operation so as to select the ATC loop 4 side, so that the temperature control of the LD 1 by the ATC is started, and the input difference voltage of the ATC stable judging section 52 is gradually reduced. Then, when the temperature of the LD 1 becomes stable at the target temperature after the wavelength switching, the output signal from the ATC stable judging section 52 is changed to a low level and the switch 50 performs the switching operation so as to select the AFC loop 3 side, and the temperature control of the LD 1 by the AFC is started as at the time of starting the apparatus, so that the optical output wavelength becomes stable at the target wavelength after the wavelength switching.

In this manner, in the third embodiment, rather than the AFC loop 3 being opened and closed by the loop opening/closing section 36 as in the case of the first embodiment, the input signal to the comparator 23 of the temperature control section 2 is switched by the switch 50 so that the temperature control section 2 operates in accordance with only one of the AFC loop 3 and the ATC loop 4. Hence, a multiple loop construction is avoided. Therefore, each of the loop time constants for the AFC loop 3 and the ATC loop 4 can be made the same. Here, the loop filter 22 provided as a part of the temperature control section 2 may be used as a common loop filter for the AFC loop 3 and the ATC loop 4. As a result, there is no longer necessary, as in the case of the first embodiment, to delay the loop time constant of the AFC sufficiently with respect to the loop time constant of the ATC. Hence, the wavelength control time until the optical output wavelength is stabilized can be shortened.

Next is a description of an optical transmission apparatus of a fourth embodiment.

In general, it is known that for LDs used in optical transmission apparatus, even if the ambient temperature is kept constant, a so-called wavelength drift occurs where the optical output wavelength is temporarily changed. In the abovementioned first through third embodiments, in the case where this wavelength drift occurs, since the wavelength after the ATC operation has stabilized at the time of restarting the apparatus, is changed from the wavelength before the occurrence of wavelength drift, there is the possibility that the optical output wavelength is controlled to a stable point outside the target wavelength by the AFC operation subsequent to the ATC operation.

Figure 19:
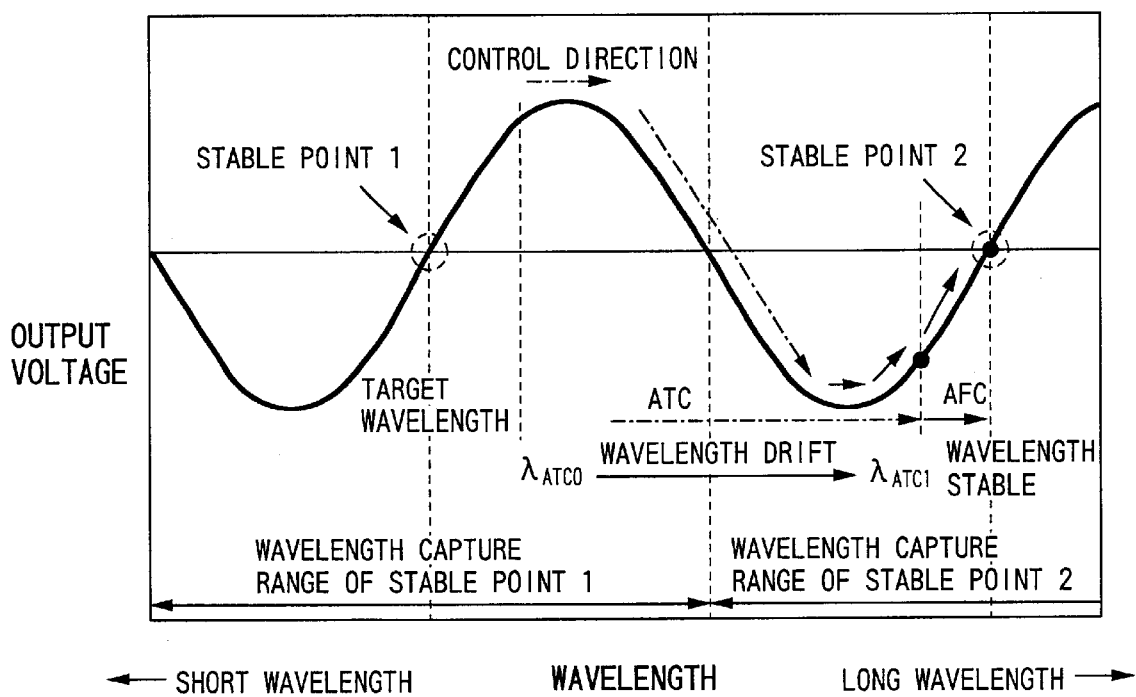
FIG. 19 is a diagram for explaining an influence of wavelength drift.

More specifically, as shown for example in FIG. 19, there is a case where a wavelength $\lambda_{ATC0}$ for when the ATC operation is stable prior to the occurrence of wavelength drift, which has been within the wavelength capture range of the stable w point 1, is changed due to the occurrence of wavelength drift to a wavelength $\lambda_{ATC1}$ for when the ATC operation is stable after an elapsed time, which is within the wavelength capture range of the stable point 2. In such a case, when the AFC operation is started, the actual optical output wavelength is controlled to the wavelength corresponding to the stable point 2, instead of the target wavelength corresponding to the stable point 1.

Therefore, in the fourth embodiment, a description is given of an optical transmission apparatus where a function for correcting the target temperature of the ATC in response to the occurrence of wavelength drift is added so that the optical output wavelength can be even more accurately controlled.

Figure 20:
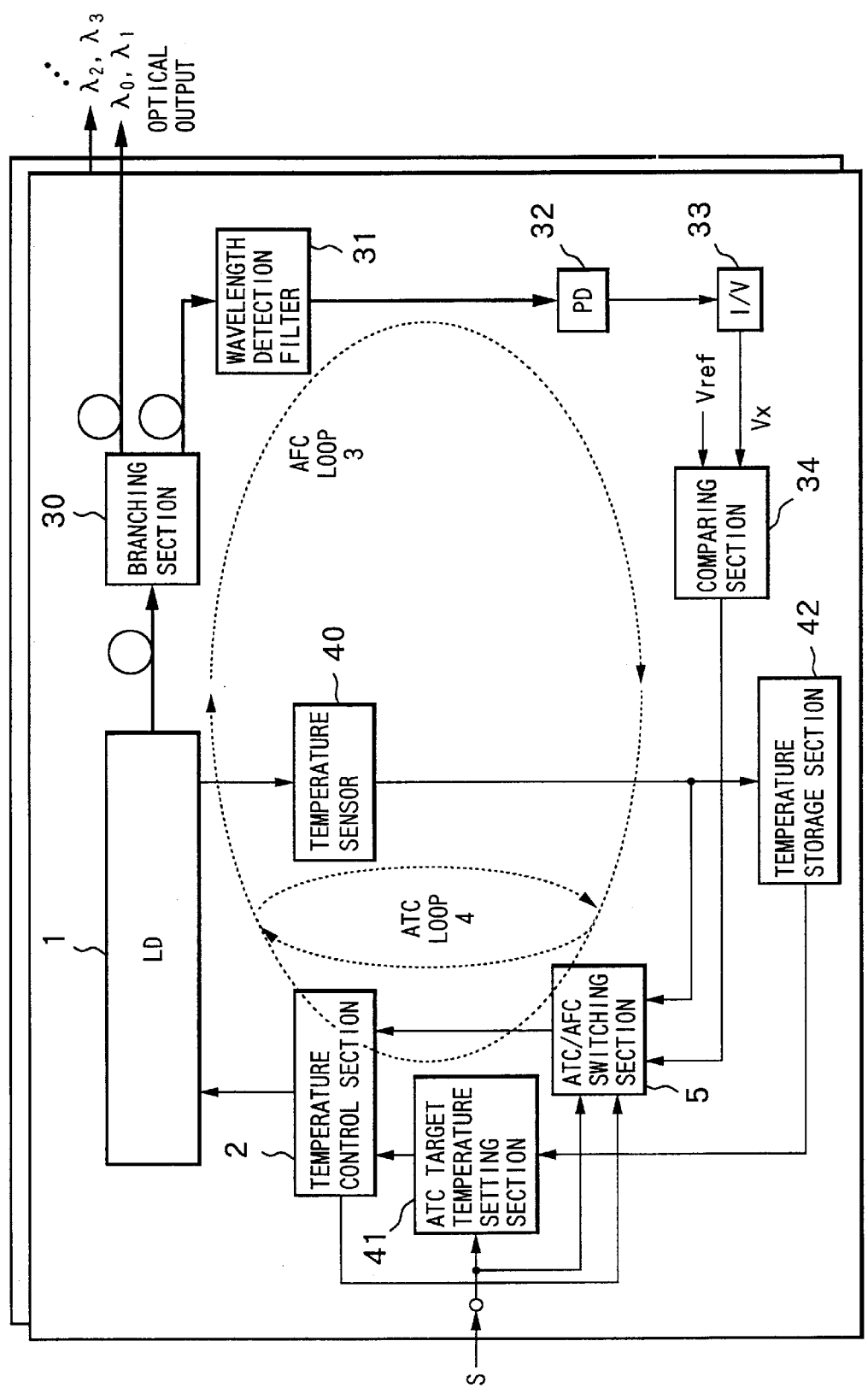
FIG. 20 is a block diagram showing a basic construction of a fourth embodiment according to the present invention.

FIG. 20 is a block diagram showing a basic construction of an optical amplifier of the fourth embodiment.

Figure 21:
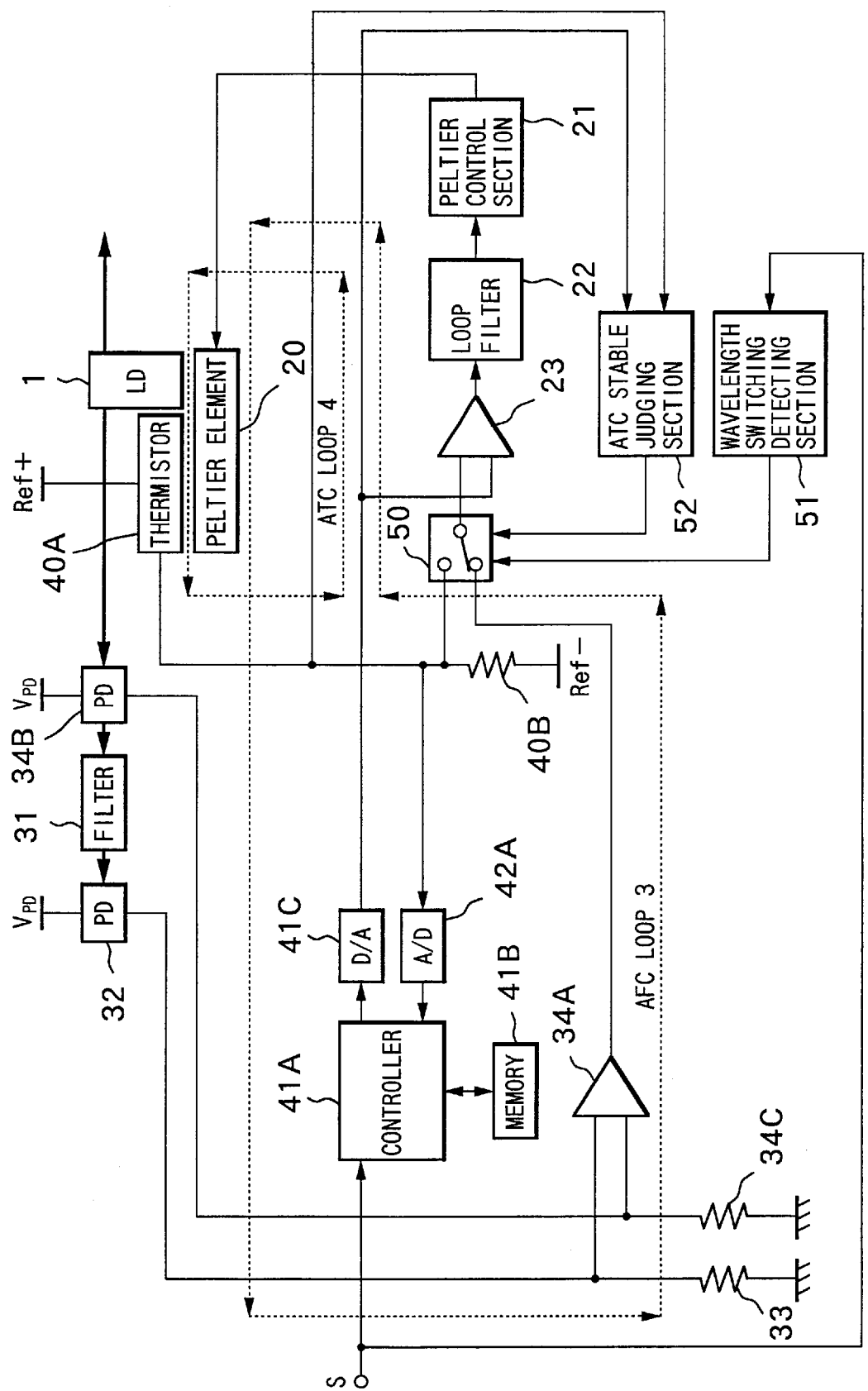
FIG. 21 is a diagram showing a specific circuit configuration example for the fourth embodiment.

In FIG. 20, this apparatus is additionally provided with a temperature storage section 42 for monitoring and storing the output signal from the temperature sensor 40, in for example the construction of the third embodiment. Construction other than this is the same as for the case of the third embodiment. FIG. 21 shows a specific circuit configuration example for the fourth embodiment. In this configuration example, the memory 41 B used in the third embodiment is used as the aforementioned temperature storage section 42, and an A/D converter 42A is connected to the controller 41A. This A/D converter 42A is input with an analog signal representing the voltage of the connection point between the thermistor 40A and the resistor 40B. This analog signal is then converted to a digital signal to be output to the controller 41A.

In the fourth embodiment of such a construction, in the case where the wavelength drift occurs, correction of the target temperature of the ATC is performed using the change in the temperature of the LD 1 when the optical output wavelength of the LD 1 is being controlled to be constant. This correction process for the target temperature of the ATC is executed for example by the procedure shown in a flow chart of FIG. 22.

Figure 22:
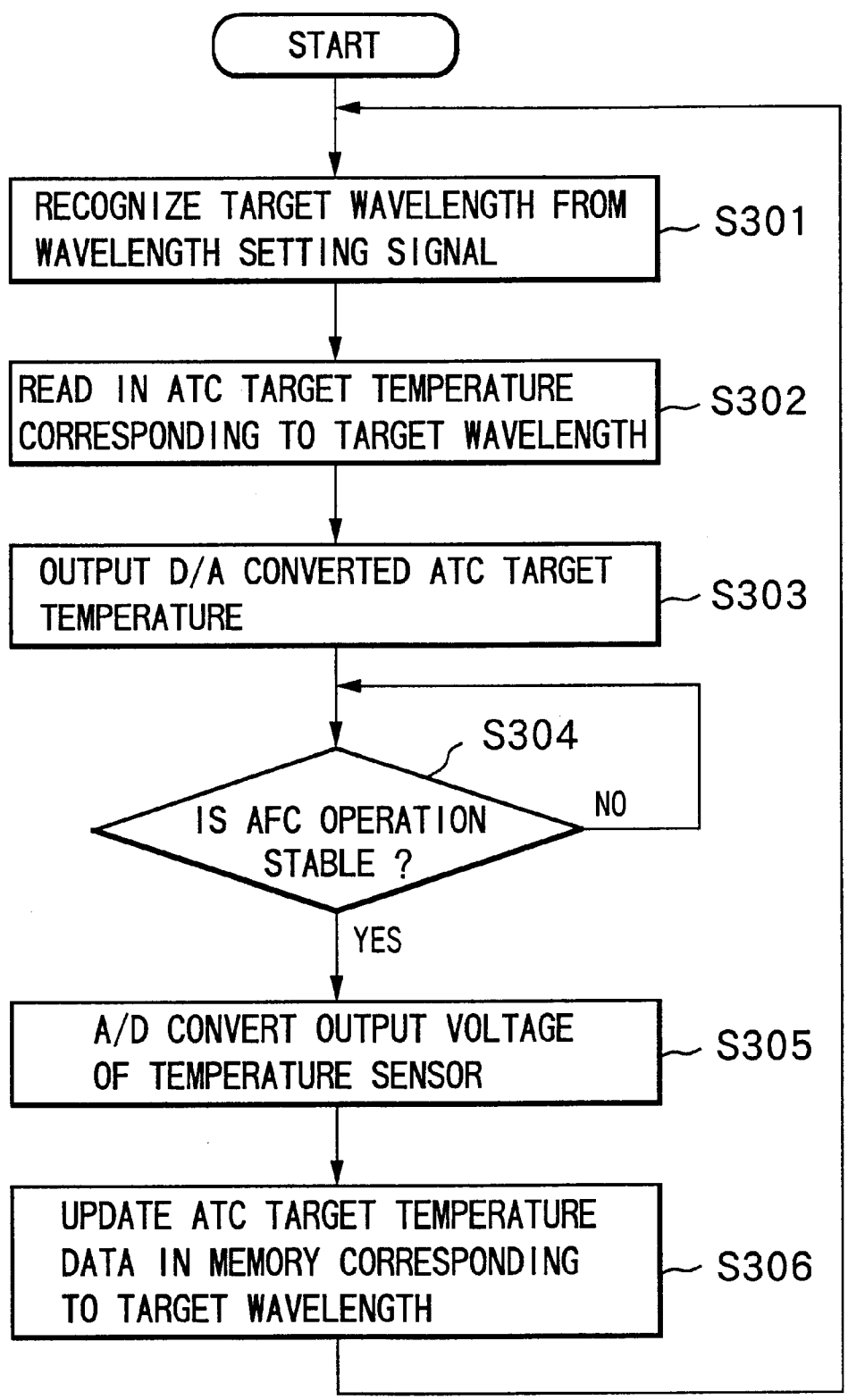
FIG. 22 is a flow chart showing an operation of the fourth embodiment.

In FIG. 22, when the apparatus is started, and in step 301, the target wavelength is recognized by the controller 41A based on the wavelength setting signal S, then in step 302, the target temperature of the ATC corresponding to the target wavelength is read out from the memory 41B, and in step 303, a digital signal representing this ATC target temperature is converted to an analog signal by the D/A converter 41C to be output. The ATC operation and the AFC operation are then sequentially executed in the same manner as for the case of the aforementioned third embodiment.

Furthermore, in step 304, it is judged whether or not the optical output wavelength of the LD 1 has stabilized at the target wavelength, and when judged to have stabilized, in step 305, the output from the temperature sensor 40 (the voltage between the thermistor 40A and the resistor 40B) is sent via the A/D converter 42A to the controller 41A. Then, in step 306, in the controller 41A, the temperature of the LD 1 for when the optical output wavelength has stabilized at the target wavelength is detected based on the signal from the A/D converter 42A, and the target temperature data of the ATC corresponding to the target wavelength stored in the memory 41B is updated. At this time, if the wavelength drift has occurred, since a deviation occurs between the target temperature of the ATC read out from the memory 41B in step 302 and the actual temperature of the LD 1, this temperature deviation is corrected. Then, the corrected ATC target temperature data is read in at the time of restarting the apparatus, and processing operations the same as mentioned above are executed.

In this manner, in the fourth embodiment, the temperature change of the LD 1 in the condition where the optical output wavelength of the LD 1 is being controlled to the target wavelength is monitored, and the target temperature data stored in the memory 41B is sequentially updated. As a result, even in a case where the wavelength drift occurs, a situation where the wavelength for when the ATC operation is stable becomes within the wavelength capture range of the other stable point which does not correspond to the target wavelength is avoided. Hence, a more accurate wavelength control becomes possible.

Figure 23:
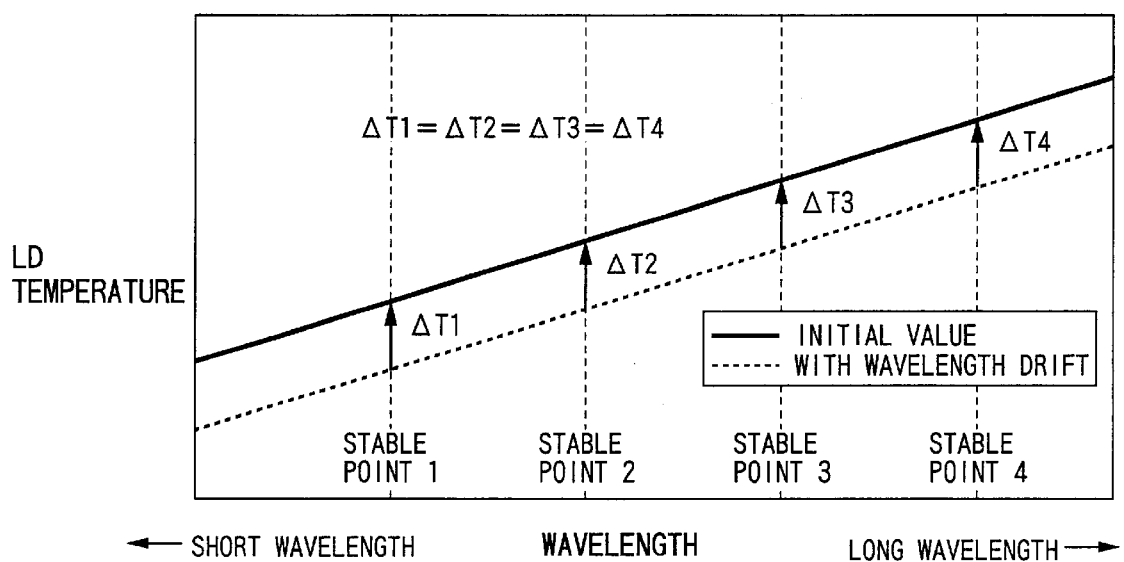
FIG. 23 is a diagram for explaining that a compensation for target temperature data is also possible for other wavelengths outside of the operating wavelengths, related to the fourth embodiment.

In the fourth embodiment, the description has been given for the case where the target temperature data of the memory 41B is corrected for an operating wavelength (the target wavelength indicated by the wavelength setting signal S). However, in the case where this apparatus is used in a system for performing switching of the operating wavelength, it is also necessary to perform correction for target temperature data other than that for the operating wavelength. As shown in FIG. 23, the wavelength drift occurs similarly at each wavelength. Therefore, in the case where the wavelength drift occurs, change amounts ($\Delta T1 \sim \alpha T4$) of the LD temperature when the wavelength is constant, are also similarly changed. Consequently, also for the target data stored in the memory 41B corresponding to wavelengths other than the operating wavelength, data correction the same as for the operating wavelength may be executed using the detected temperature change amount for the operating wavelength. As a result, it is possible to also compensate for wavelength drift other than that for the operating wavelength.

Next is a description of an optical transmission apparatus of a fifth embodiment.

In an optical transmission apparatus that performs wavelength switching, in the course of wavelength control at the time of starting the apparatus or at the time of wavelength switching, there is a possibility that the optical output wavelength intersects other operating wavelengths to occur inter-channel crosstalk. Therefore, in the fifth embodiment, a description is given of an optical transmission apparatus where the abovementioned occurrence of inter-channel crosstalk is avoided to achieve a further improvement of transmission quality.

Figure 24:
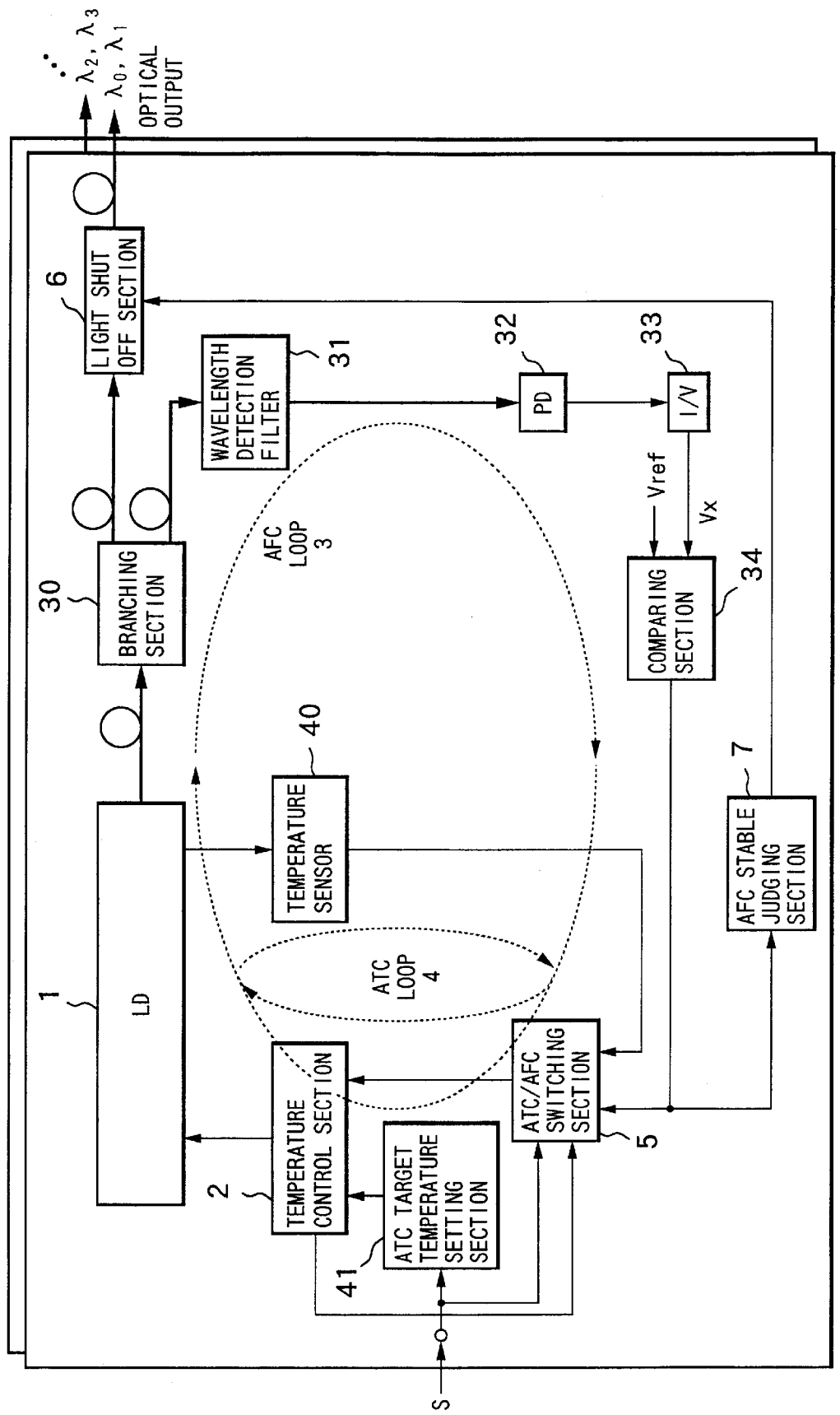
FIG. 24 is a block diagram showing a basic construction of a fifth embodiment according to the present invention.

FIG. 24 is a block diagram showing a basic construction of the optical transmission apparatus of the fifth embodiment.

In FIG. 24, this apparatus is one where for example in the construction of the third embodiment, a light shut off section 6 is provided along the transmission path for the light output to the outside from the LD 1 via the branching section 30, and an AFC stable judging section 7 that controls an operation of the light shut off section 6 is provided. Construction other than this is the same as for the case of the third embodiment. Here, the light shut off section 6 and the AFC stable judging section 7 function as light shut off means.

The AFC stable judging section 7 judges whether or not the AFC operation has stabilized, based on the signal output from the comparing section 34 of the AFC loop 3, and controls the light shut off section 6 so as to shut off the output light during the wavelength control transition period of when the AFC operation is not stable during wavelength control transition, and controls the light shut off section 6 so as to output the output light to the outside when the AFC operation has stabilized.

Figure 25:
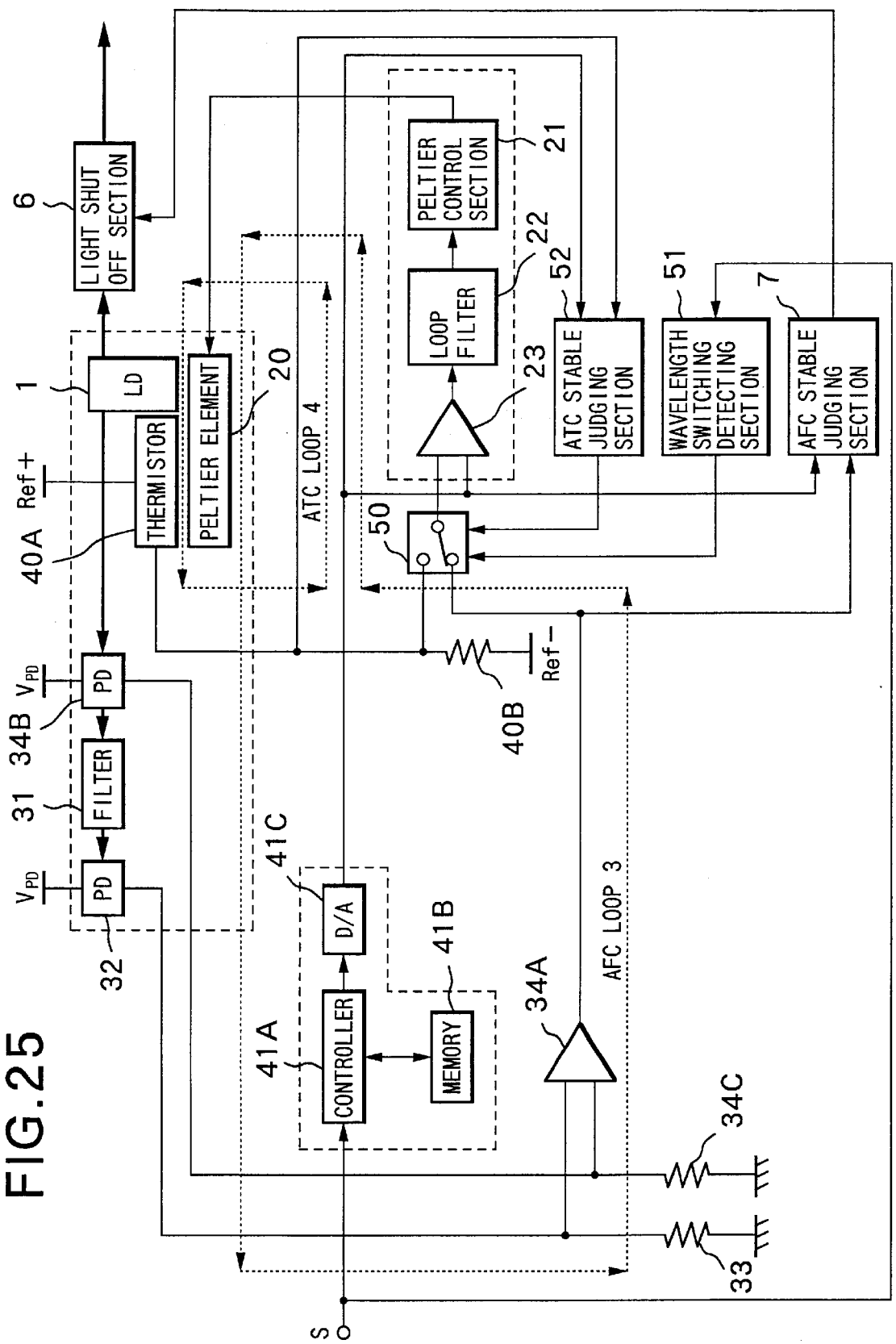
FIG. 25 is a diagram showing a specific circuit configuration example for the fifth embodiment.

FIG. 25 shows a specific circuit configuration for the fifth embodiment.

In the configuration example of FIG. 25, the light shut off section 6 is provided along the transmission path of the light output from the front face of the LD 1. Furthermore, the AFC stable judging section 7, here, is input with the respective output signals from the comparator 34A and the D/A converter 41C, and based on these signals, judges the stability of the AFC operation to output a signal for controlling the operation of the light shut off section 6.

Figure 26:
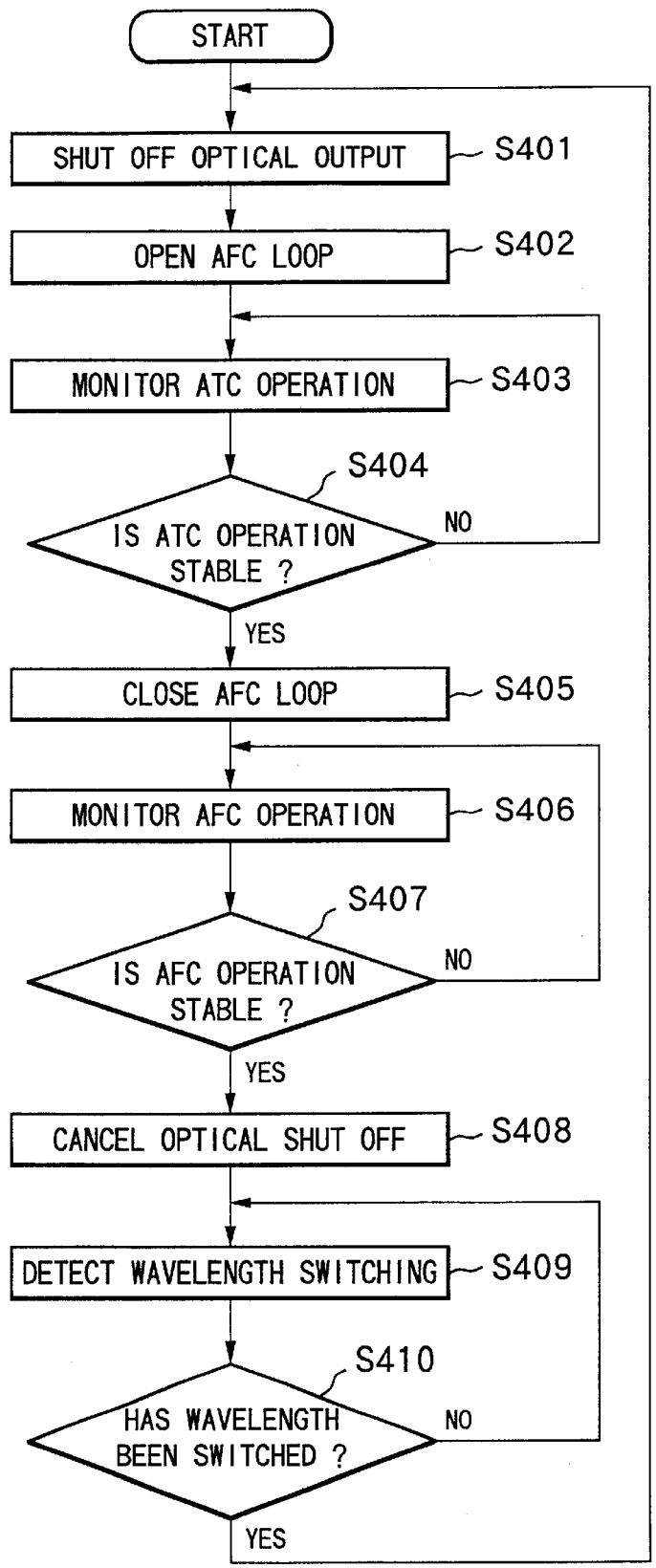
FIG. 26 is a flow chart showing an operation of the fifth embodiment.
Figure 27:
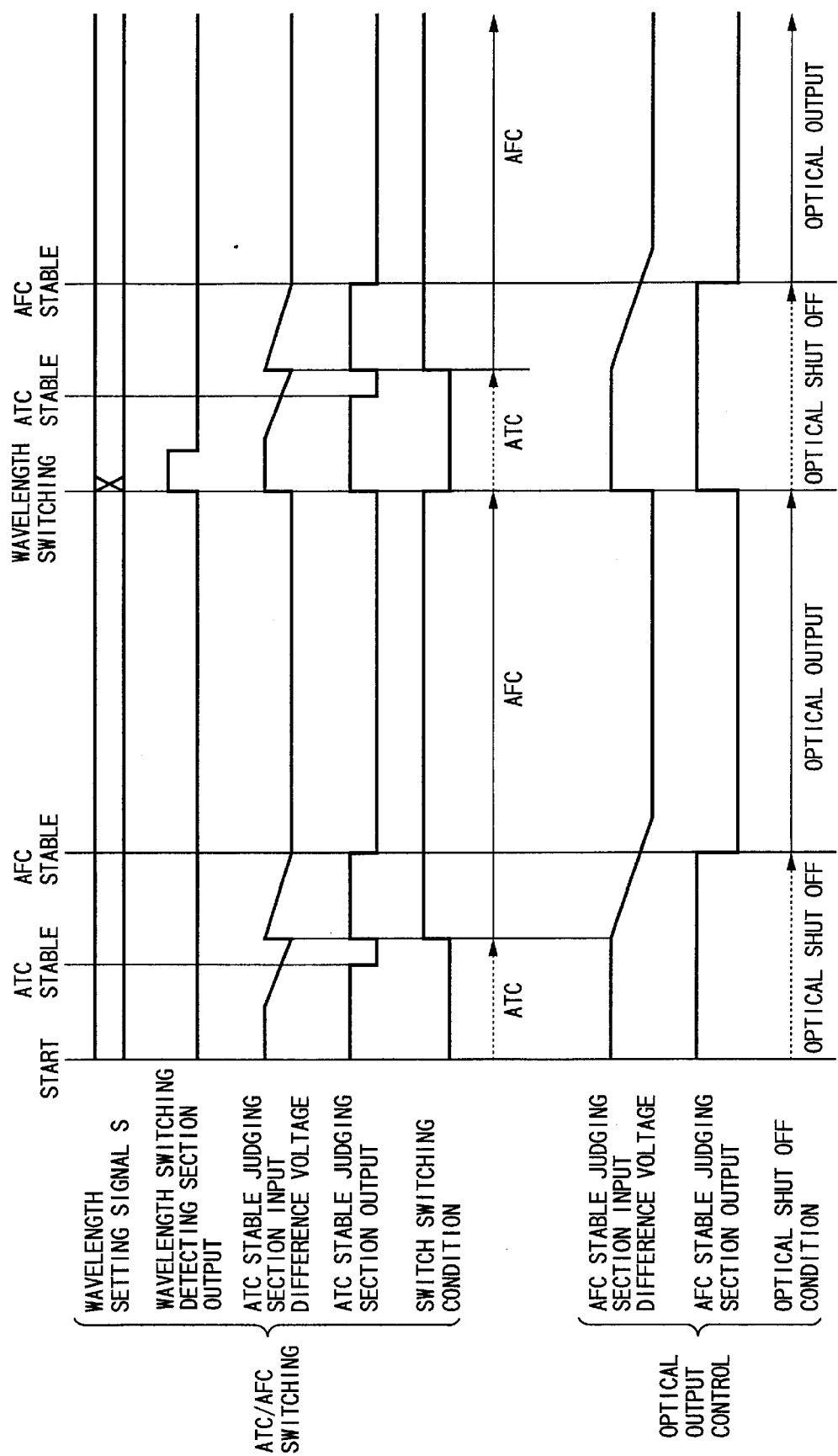
FIG. 27 is a time chart showing the operation of the fifth embodiment.

Here, the operation of the fifth embodiment is described using a flow chart of FIG. 26 and a time chart of FIG. 27.

At first, when the apparatus is started, in the case where the temperature of the LD 1 is deviated from the target temperature of the ATC, then as shown in FIG. 27, the output voltage from the comparator 23, the output signal from the ATC stable judging section 52 and an output signal from the AFC stable judging section 7 all become a high level. As a result, in step 401 of FIG. 26, the light shut off section 6 is switched to the shut off condition so that the output light is shut off. Furthermore simultaneously with this, in step 402, the switch 50 performs the switching operation so as to select the ATC loop 4 side, so that the temperature control of the LD 1 by the ATC is started, and the input voltage difference of the ATC stable judging section 52 is gradually reduced.

Then in step 403, the ATC stable judging section 52 monitors the control condition of the ATC, and in step 404, if judged that the ATC is stable, the output signal from the ATC stable judging section 52 becomes a low level. In step 405, on receipt of the low level output signal from the ATC stable judging section 52, the switch 50 performs the switching operation so as to select the AFC loop 3 side, so that the temperature control of the LD 1 by the AFC is started. Immediately after starting the AFC operation, the output signal from the ATC stable judging section 52 becomes a high level, and with continuation of the AFC operation, the input voltage difference of the ATC stable judging section 52 is gradually reduced.

In step 406, the AFC stable judging section 7 monitors the control condition of the AFC, and in step 407, if judged that the AFC is stable, the output signal from the AFC stable judging section 7 becomes a low level. As a result, in step 408, the shut off condition of the light shut off section 6 is cancelled so that the output light is sent to the outside, and the control operation at the starting of the apparatus is terminated to enter the normal operation condition.

Then, in step 409, the change in the wavelength setting signal S is monitored in the wavelength switching detecting section 51, and in step 410, if the change in the wavelength setting signal S indicating the wavelength switching is detected, control returns to step 401, and the abovementioned series of control operations is repeated.

Figure 28:
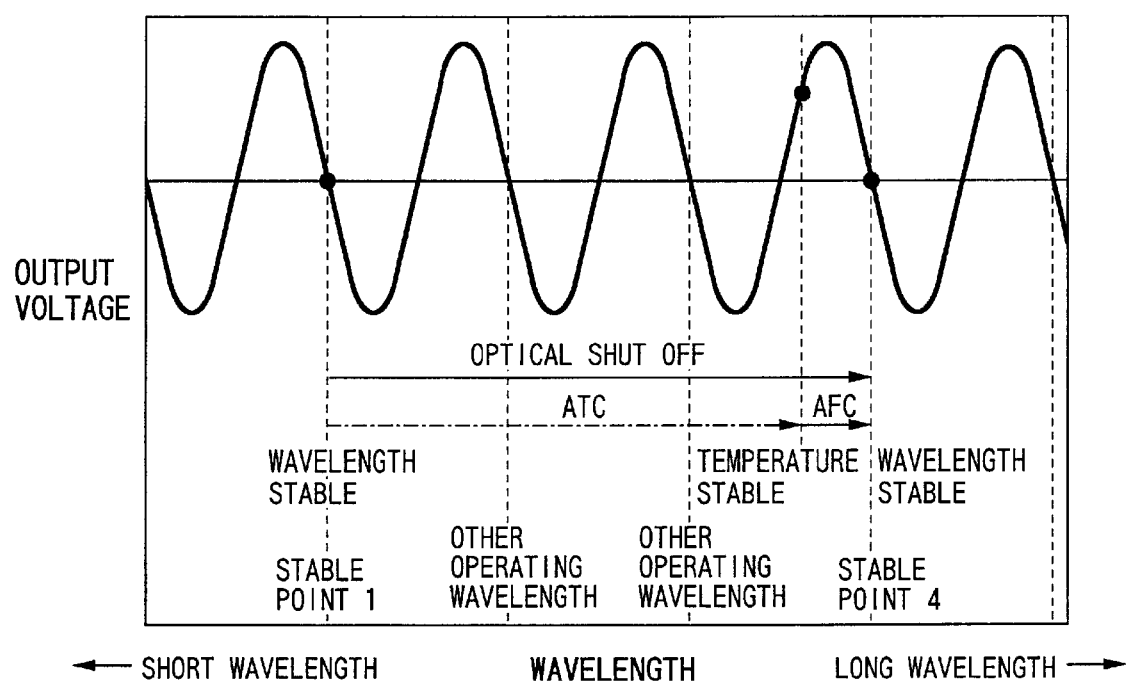
FIG. 28 is a diagram for explaining a light shut off condition of the fifth embodiment.

With the present apparatus operated in this manner, in the case where for example as shown in FIG. 28, the optical output wavelength of the LD 1 is switched from a wavelength corresponding to the stable point 1 to a wavelength corresponding to the stable point 4, then when the wavelength which has been controlled to the stable point 1 is shifted to the wavelength capture range of the stable point 4 by the ATC operation, the optical output wavelength intersects the other operating wavelengths (in the example of the figure, two wavelengths). However, during the transition period until the optical output wavelength stabilizes at the wavelength corresponding to the stable point 4, since the output of light to the outside is shut off by the light shut off section 6, crosstalk with another operating wavelength is prevented.

According to the fifth embodiment as described above, the construction is such that the optical output during the wavelength control transition period is shut off, the occurrence of inter-channel crosstalk can be prevented, and an optical transmission apparatus of a high transmission quality can be provided.

INDUSTRIAL APPLICABILITY

The present invention has considerable industrial applicability as an optical transmission apparatus and a method of controlling optical transmission wavelengths, used in various optical transmission systems applied with wavelength division multiplexing technology.

What is claimed:

1. An optical transmission apparatus for multiple wavelengths comprising:

a light source generating light having a wavelength which changes according to temperature;

temperature control means for controlling a temperature of said light source; and a wavelength control loop detecting wavelengths of light output from said light source and feedback controlling an operation of said temperature control means based on the detected optical output wavelengths, to thereby capture said optical output wavelengths which are within a predetermined wavelength capture range into the vicinity of a target wavelength, wherein:

said optical transmission apparatus for multiple wavelengths further comprises a temperature control loop detecting the temperature of said light source and feedback controlling the operation of said temperature control means in accordance with the detected temperature, so that the optical output wavelengths of said light source fall within a wavelength capture range corresponding to the target wavelength of said wavelength control loop, said wavelength control loop detects the optical output wavelengths of said light source using a wavelength detection filter having a periodic transmission wavelength characteristic capable of setting a plurality of stable points for a wavelength capture operation, and starts the wavelength capture operation after an operation of said temperature control loop has stabilized, and said wavelength control loop incorporates a control polarity switching section which reverses a control direction of the capture operation in accordance with switching of the target wavelength.

2. An optical transmission apparatus according to claim 1, wherein said temperature control loop comprises:

a temperature sensor that detects the temperature of said light source and transmits the detected temperature to said temperature control means; and a target temperature setting section that sets, depending on the setting of the target wavelength, a target temperature in said temperature control means such that the optical output wavelengths of said light source fall within the wavelength capture range corresponding to said target wavelength of said wavelength control loop.

3. An optical transmission apparatus according to claim 1, further comprising control loop switching means for selectively switching either one of said temperature control loop and said wavelength control loop based on control conditions of said temperature control means.

4. An optical transmission apparatus according to claim 1, further comprising light shut off means for shutting off light output from said light source during a period from a starting of operation by said temperature control loop until the wavelength capture operation by said wavelength control loop becomes stable.

5. An optical transmission apparatus for multiple wavelengths comprising:
   a light source generating light having a wavelength which changes according to temperature;
   temperature control means for controlling a temperature of said light source; and
   a wavelength control loop detecting wavelengths of light output from said light source and feedback controlling an operation of said temperature control means based on the detected optical output wavelengths, to thereby capture said optical output wavelengths which are within a predetermined wavelength capture range into the vicinity of a target wavelength, wherein:
      said optical transmission apparatus for multiple wavelengths further comprises a temperature control loop detecting the temperature of said light source and feedback controlling the operation of said temperature control means in accordance with the detected temperature, so that the optical output wavelengths of said light source fall within a wavelength capture range corresponding to the target wavelength of said wavelength control loop,
      said wavelength control loop detects the optical output wavelengths of said light source using a wavelength detection filter having a transmission wavelength characteristic capable of setting a plurality of stable points for a wavelength capture operation, and starts the wavelength capture operation after an operation of said temperature control loop has stabilized, and
      said temperature control loop comprises:
         a temperature sensor that detects the temperature of said light source and transmits the detected temperature to said temperature control means;
         a target temperature setting section that sets, depending on the setting of the target wavelength, a target temperature in said temperature control means such that the optical output wavelengths of said light source fall within the wavelength capture range corresponding to said target wavelength of said wavelength control loop; and
         a temperature storage section that stores the temperature of said light source detected by said temperature sensor when the optical output wavelengths of said light source have stabilized in the vicinity of the target wavelength, and said target temperature setting section sets a target temperature corresponding to the target wavelength based on storage data of said temperature storage section.

6. An optical transmission apparatus according to claim 2, wherein said wavelength detection filter has a periodic transmission wavelength characteristic.

7. An optical transmission apparatus according to claim 2, wherein said temperature control loop has a memory that stores target temperature data respectively set in advance corresponding to a plurality of target wavelengths, and is provided with a function for calculating a temperature change amount, which occurs due to wavelength drift, for an operating wavelength, based on the temperature of said light source detected by said temperature sensor when the optical output wavelength of said light source has stabilized at said operating wavelength, and corrects each target temperature data stored in said memory according to the computed temperature change amount.

8. An optical transmission apparatus according to claim 2, further comprising light shut off means for shutting off light output from said light source during a period from a starting of operation by said temperature control loop until the wavelength capture operation by said wavelength control loop becomes stable.

9. A method of controlling optical transmission wavelengths for detecting wavelengths of light output from a light source and feedback controlling a temperature of the light source based on the detected optical output wavelengths, to thereby capture the optical output wavelengths which are within a predetermined wavelength capture range into the vicinity of a target wavelength, comprising:
   controlling the temperature of the light source so that the optical output wavelengths of the light source fall within a wavelength capture range corresponding to a target wavelength of a wavelength control;
   thereafter, detecting the optical output wavelengths of the light source using a wavelength detection filter having a periodic transmission wavelength characteristic capable of multiply setting stable points for a wavelength capture operation of the wavelength control;
   starting the wavelength capture operation depending on the detected optical output wavelengths; and
   reversing a control direction of the wavelength capture operation in accordance with switching of the target wavelength.

10. A method of controlling optical transmission wavelengths for detecting wavelengths of light output from a light source and feedback controlling temperature of the light source based on the detected optical output wavelengths, to thereby capture the optical output wavelengths which are within a predetermined wavelength capture range into the vicinity of a target wavelength, comprising:
   controlling the temperature of the light source by setting a target temperature such that the optical output wavelengths of the light source fall within the wavelength capture range corresponding to the target wavelength based on stored data of the temperature of the light source detected when the optical output wavelengths of the light source have stabilized in the vicinity of the target wavelength;
   thereafter, detecting the optical wavelengths of the light source using a wavelength detection filter having a transmission wavelength characteristic capable of multiply setting stable points for a wavelength capture operation of the wavelength control; and
   starting the wavelength capture operation depending on the detected optical output wavelengths.

11. A method of controlling optical transmission wavelengths, comprising:
   controlling a temperature of a light source so that optical output wavelengths of the light source are within a range corresponding to a target wavelength;
   detecting the optical output wavelengths of the light source;

performing a wavelength capture operation based on the detected optical output wavelengths;

reversing a control direction of the wavelength capture operation in accordance with switching of the target wavelength.

12. A method of controlling optical transmission wavelengths, comprising:

detecting a temperature of a light source when optical output wavelengths of the light source have stabilized in the vicinity of a target wavelength;

storing the detected temperature as storage data;

setting a target temperature corresponding to the target wavelength based on the storage data; and controlling the temperature of the light source by setting a target temperature such that the optical output wavelengths of the light source fall within a range corresponding to the target wavelength based on the storage data.

* * * * *